US006806477B1

(12) United States Patent
Saito et al.

(10) Patent No.: US 6,806,477 B1
(45) Date of Patent: Oct. 19, 2004

(54) POSITION DETECTION DEVICE, APPARATUS USING THE SAME, EXPOSURE APPARATUS, AND DEVICE MANUFACTURING METHOD USING THE SAME

(75) Inventors: Kenji Saito, Utsunomiya (JP); Toshihiko Tsuji, Utsunomiya (JP); Mitsuro Sugita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/645,434

(22) Filed: Aug. 25, 2000

Related U.S. Application Data

(62) Division of application No. 09/082,587, filed on May 21, 1998.

(30) Foreign Application Priority Data

| May 23, 1997 | (JP) | ............................................. 9-150072 |
| May 23, 1997 | (JP) | ............................................. 9-150073 |
| May 23, 1997 | (JP) | ............................................. 9-150074 |
| Dec. 8, 1997 | (JP) | ............................................. 9-354130 |

(51) Int. Cl.$^7$ .............................................. G03F 9/00
(52) U.S. Cl. .................................................. 250/491.1
(58) Field of Search .......................... 250/491.1, 492.2, 250/251; 438/949

(56) References Cited

U.S. PATENT DOCUMENTS

| 3,808,550 A | * | 4/1974 | Ashkin ........................ 250/251 |
| 4,659,429 A | | 4/1987 | Isaacson et al. ............. 156/644 |
| 4,670,650 A | | 6/1987 | Matsuzawa et al. ..... 250/491.1 |
| 4,727,278 A | | 2/1988 | Staufenberg, Jr. ........... 310/328 |
| 4,812,661 A | | 3/1989 | Owen ....................... 250/492.2 |
| 4,947,034 A | | 8/1990 | Wickramasinghe et al. . 250/216 |
| 5,106,455 A | | 4/1992 | Jacobsen et al. ............ 438/949 |
| 5,117,110 A | | 5/1992 | Yasutake ..................... 250/306 |
| 5,121,256 A | | 6/1992 | Corle et al. ................. 359/664 |
| 5,270,794 A | | 12/1993 | Tsuji et al. .................. 356/371 |
| 5,343,460 A | | 8/1994 | Miyazaki et al. ........... 369/126 |

(List continued on next page.)

FOREIGN PATENT DOCUMENTS

| EP | 0 502 679 | 9/1992 |
| JP | 4-186716 | 7/1992 |
| JP | 4-267536 | 9/1992 |
| JP | 6-204118 | 7/1994 |
| JP | 7-270123 | 10/1995 |
| JP | 8-45814 | 2/1996 |
| JP | 8-321454 | 12/1996 |

OTHER PUBLICATIONS

Stover, et al., "Mix and match of 10:1 wafer steppers with die–by–die alignment to 1:1 proximity and projection systems", *SPIE*, pp. 555–566 (Jan. 1992).

(List continued on next page.)

*Primary Examiner*—Jack Berman
(74) *Attorney, Agent, or Firm*—Fitzpatrick, Cella, Harper & Scinto

(57) ABSTRACT

A position detection device for detecting a position of an object. The detection device includes an irradiation device for irradiating light onto an alignment mark formed on a surface of the object, a probe for detecting near-field light in the vicinity of the alignment mark upon irradiation by the irradiation device and a detector for detecting position information of the object on the basis of the near-field light detected by the probe.

20 Claims, 31 Drawing Sheets

U.S. PATENT DOCUMENTS

| | | | |
|---|---|---|---|
| 5,362,585 A | 11/1994 | Adams | 430/30 |
| 5,384,464 A | 1/1995 | De Fornel et al. | 250/492.2 |
| 5,415,835 A | 5/1995 | Brueck et al. | 430/311 |
| 5,445,011 A | 8/1995 | Ghislain et al. | 73/105 |
| 5,486,919 A | 1/1996 | Tsuji et al. | 356/349 |
| 5,618,760 A | 4/1997 | Soh et al. | 438/703 |
| 5,955,776 A | 9/1999 | Ishikawa | 257/618 |
| 5,968,693 A | 10/1999 | Adams | 430/30 |
| 5,981,119 A | 11/1999 | Adams | 430/30 |
| 5,989,764 A | 11/1999 | Adams | 430/30 |
| 6,046,972 A | 4/2000 | Kuroda et al. | 369/128 |
| 6,097,473 A | 8/2000 | Ota et al. | 355/53 |

OTHER PUBLICATIONS

Carpenter, et al., "Mixing 1X scanning and 5X step–and–repeat exposure systems in a semiconductor processing line", *SPIE*, pp. 567–572 (Jan. 1992).

Jonckheere, et al., "Electron beam / DUV Intra–level mix–and–match lithography for random logic $0.25\mu m$ CMOS", *Microelectronic Engineering*, vol. 27, No. 1/04, pp. 231–234 (Feb. 1995).

Hattori, et al., "Target X–ray source lithography and photo lithography mixed and match system", *SPIE*, vol. Conf. 1, pp. 110–115 (Mar. 1990).

\* cited by examiner

POSITION DETECTION DEVICE, APPARATUS USING THE SAME, EXPOSURE APPARATUS, AND DEVICE MANUFACTURING METHOD USING THE SAME

This application is a divisional of copending Application No. 09/082,587, filed May 21, 1998.

BACKGROUND OF THE INVENTION

1. Field of the Invention

The present invention relates to a position detection device, an apparatus using the same, an exposure apparatus, and a device manufacturing method using the same and, more particularly, to a technique suitably used when the position information of an object is detected on the nanometer order, and the surface of the object is optically processed using the position information, or a microstructure on the object surface is inspected.

Also, the present invention relates to a technique suitable for an apparatus for detecting the position information of an object such as a mask, wafer, or the like with high precision by observing images of alignment marks formed on the object, aligning the object on the basis of the detected position information, and manufacturing a device or the like in a projection exposure apparatus which is used in the manufacture of various kinds of devices such as semiconductor ICs, LSIs. CCDs, liquid crystal panels, magnetic heads, and the like using the step-and-repeat or step-and-scan method.

2. Related Background Art

In recent exposure apparatuses for manufacturing devices, higher-precision alignment systems are required for aligning a wafer and reticle relative to each other in the exposure apparatus as the resolution of the pattern image to be projected becomes higher. Especially, the exposure apparatus must obtain both a high-resolution pattern to be projected and high-precision position information.

Conventionally, in an optical working tool (micro-working tool) for manufacturing a device by sequentially forming electronic circuit patterns on an object surface (silicon surface), an inspection tool for inspecting a microstructure such as a molecular structure or the like on the object surface, and the like, a position detection device for detecting the position information of the object is used, and driving of the object is controlled using the obtained position information.

In position detection devices used in the manufacture of devices disclosed in, e.g., Japanese Laid-Open Patent Nos. 4-267536, 4-186716, 8-321454, and the like, alignment marks formed on the object surface are irradiated with alignment light, optical images of the alignment marks are detected using an observation system (TV camera, and the like), and the detected images are subjected to image processing to detect the position information of the object.

Also, in a position detection device disclosed in Japanese Laid-Open Patent No. 7-270123, a diffraction grating is disposed on the object surface, and the position information of the object is detected using in-th-order diffracted light produced by the diffraction grating.

In the position detection device that obtains the position information of the object by optically detecting the positions of the alignment marks formed on the object surface, the detection precision is limited by a spread of optical images arising from the wavelength of alignment light, manufacturing errors of an alignment detection system, aberrations of the alignment optical system, and the like, and it is very hard to obtain precision on the subnanometer order.

Also, even in exposure on the nanometer order, since the detection precision of the alignment optical system has the above-mentioned limitations, it is very hard to obtain precision on the subnanometer order.

SUMMARY OF THE INVENTION

It is an object of the present invention to provide a position detection device, which detects the position information of the object by bringing a probe close to a near field formed on an object surface upon irradiation of pumping light onto an alignment mark formed on the object surface, and detecting scattered light based on the near-field light obtained at that time, and is suitable for a micro-working tool used in the manufacture of semiconductor elements, a microstructure inspection tool for inspecting the microstructure of the object surface, and to provide an apparatus using the same, an exposure apparatus, and a device manufacturing method using the same.

In order to achieve the above object, a position detection device according to the present invention comprises the following arrangement. That is, there is provided a position detection device for detecting a position of an object, comprising irradiation means for irradiating pumping light onto an alignment mark formed on a surface of the object, a probe for detecting near-field light that has been pumped in the vicinity of the alignment mark upon irradiation by the irradiation means, and detection means for detecting position information of the object on the basis of the near-field light detected by the probe.

In order to achieve the above object, a working apparatus according to the present invention comprises the following arrangement. That is, there is provided a working apparatus for detecting position information of a member to be worked using a position detection device, which detects a position of an object, and comprises irradiation means for irradiating pumping light onto an alignment mark formed on a surface of the object, a probe for detecting near-field light that has been pumped in the vicinity of the alignment mark upon irradiation by the irradiation means, and detection means for detecting position information of the object on the basis of the near-field light detected by the probe, and working a surface of the member to be worked using the position information.

In order to achieve the above object, an evaluation apparatus according to the present invention comprises the following arrangement. That is, there is provided an evaluation apparatus for detecting position information of a specimen to be evaluated using a position detection device, which detects a position of an object, and comprises irradiation means for irradiating pumping light onto an alignment mark formed on a surface of the object, a probe for detecting near-field light that has been pumped in the vicinity of the alignment mark upon irradiation by the irradiation means, and detection means for detecting position information of the object on the basis of the near-field light detected by the probe, and inspecting the specimen to be evaluated using the position information.

In order to achieve the above object, an exposure apparatus according to the present invention comprises the following arrangement. That is, there is provided an exposure apparatus for detecting position information of an object to be exposed using a position detection device, which detects a position of an object, and comprises irradiation means for irradiating pumping light onto an alignment mark formed on a surface of the object, a probe for detecting near-field light that has been pumped in the vicinity of the alignment mark upon irradiation by the irradiation means, and detection means for detecting position information of the object on the basis of the near-field light detected by the probe, and exposing a surface of the object using the position information.

In order to achieve the above object, an exposure apparatus according to the present invention comprises the following arrangement. That is, there is provided an exposure apparatus which detects position information of an object to be exposed applied with a resist using a fine alignment system, aligns the object to be exposed using a signal from the fine alignment system, and forms a pattern by irradiating exposure light onto a surface of the object, the fine alignment system comprising irradiation means for irradiating pumping light onto an alignment mark formed on the object to be exposed or a substrate on which the object to be exposed is placed, a probe for interacting with a near field pumped in the vicinity of the alignment mark, an optical detector for receiving near-field light present in the near field using the probe, control means for obtaining position information of the object to be exposed using a signal from the optical detector, and drive means for aligning the object to be exposed by driving the object on the basis of a signal from the control means.

In order to achieve the above object, an exposure apparatus according to the present invention comprises the following arrangement. That is, there is provided an exposure apparatus for irradiating exposure light onto a surface of an object to be exposed applied with a resist to form a pattern on the surface, wherein near-field light is used as the exposure light.

In order to achieve the above object, an exposure apparatus according to the present invention comprises the following arrangement. That is, there is provided an exposure apparatus for irradiating exposure light onto a surface of a substrate applied with a resist to form a pattern on the surface, wherein the apparatus uses different exposure means on the basis of a type of microstructure of a pattern.

Other features and advantages of the present invention will be apparent from the following description taken in conjunction with the accompanying drawings, in which like reference characters designate the same or similar parts throughout the figures thereof.

DETAILED DESCRIPTION OF THE PREFERRED EMBODIMENTS

First Embodiment

Figure 1:
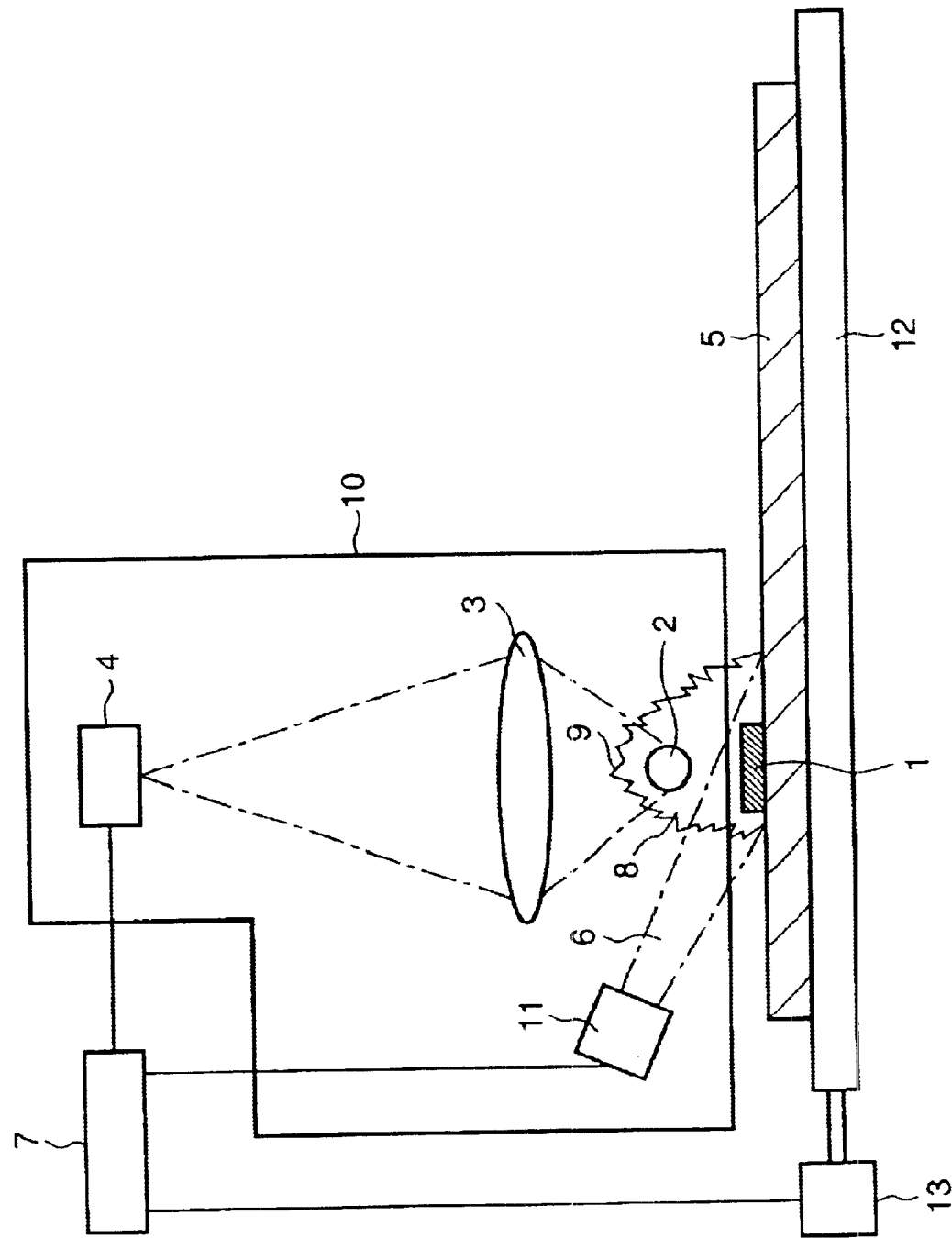
FIG. 1 is an explanatory view of the detection principle of a position detection device of the present invention.

FIG. 1 is a schematic view showing a principal part of the detection principle of a position detection device according to the first embodiment of the present invention. The position detection device of the present invention irradiates pumping light onto the object surface to form a near field on that region. The field of polarization produced in an object by the irradiated light is a nonuniform, nonradiative local electromagnetic field formed by the substance structure, and is called a near field. Such near-field light spreads within the range on the wavelength order of that light in the vicinity of the surface of an object. When a small object is brought close to the near-field light, the near field changes, and scattered light is produced.

In the first embodiment, the optical information distribution of the object is obtained by detecting the scattered light at that time, and the position information of the object is detected with resolution on the molecular order.

In this embodiment, the respective components at that time form a position detection system. The resolution of the position detection system is determined by the size of the small object (probe) to be brought close independently of the wavelength of light, and an object much smaller than the wavelength can be resolved.

In this embodiment, the position information of the object is detected with precision on the subnanometer order using such a position detection system.

FIG. 1 shows the detection principle of the position detection device using the near-field light. An alignment mark 1 is formed on an object 5, the position of which is to be detected.

In FIG. 1, a near-field optical system 10 is made up of a light irradiation means (irradiation means) 11 for irradiating pumping light (irradiation light) 6 onto a region around the alignment mark 1, probe 2, focusing lens 3, detector 4, and the like. The optical system 10 detects the light distribution of a near field 8 in the vicinity of the alignment mark 1 as an image (near-field optical image).

The difference between the near field optical system 10 and a normal optical microscope is the presence of a small scattering member (probe) 2 on the alignment mark 1 formed on the surface of an object 5. The pumping light (irradiation light) 6 coming from the light irradiation means 11 is diffracted/scattered or absorbed by the alignment mark 1 formed on the surface of the object 5. The near field 8 is formed in the vicinity of the alignment mark 1. The probe 2 interacts with the near field 8 to change it, thus forming a new near field.

The changed near field produces scattered light 9 based on the near-field light present there, and the scattered light 9 is detected by the detector 4 via the lens 3. For this reason, the lens 3 need not have any imaging function since it merely condenses scattered light coming from the probe 2.

Unlike in the normal optical system, the resolution is determined by the size of the probe 2, the distance thereof from the alignment mark 1, and the like independently of the image performance of the lens 3. Image data based on the alignment mark 1 obtained by such a near-field optical system 10 is processed and analyzed by a controller 7 to obtain the position information of the alignment mark 1, thus detecting the position information of the object 5.

In FIG. 1, the object 5, the position of which is to be detected, is placed on a stage 12, and its position is controlled by a stage drive system 13.

Figure 2:
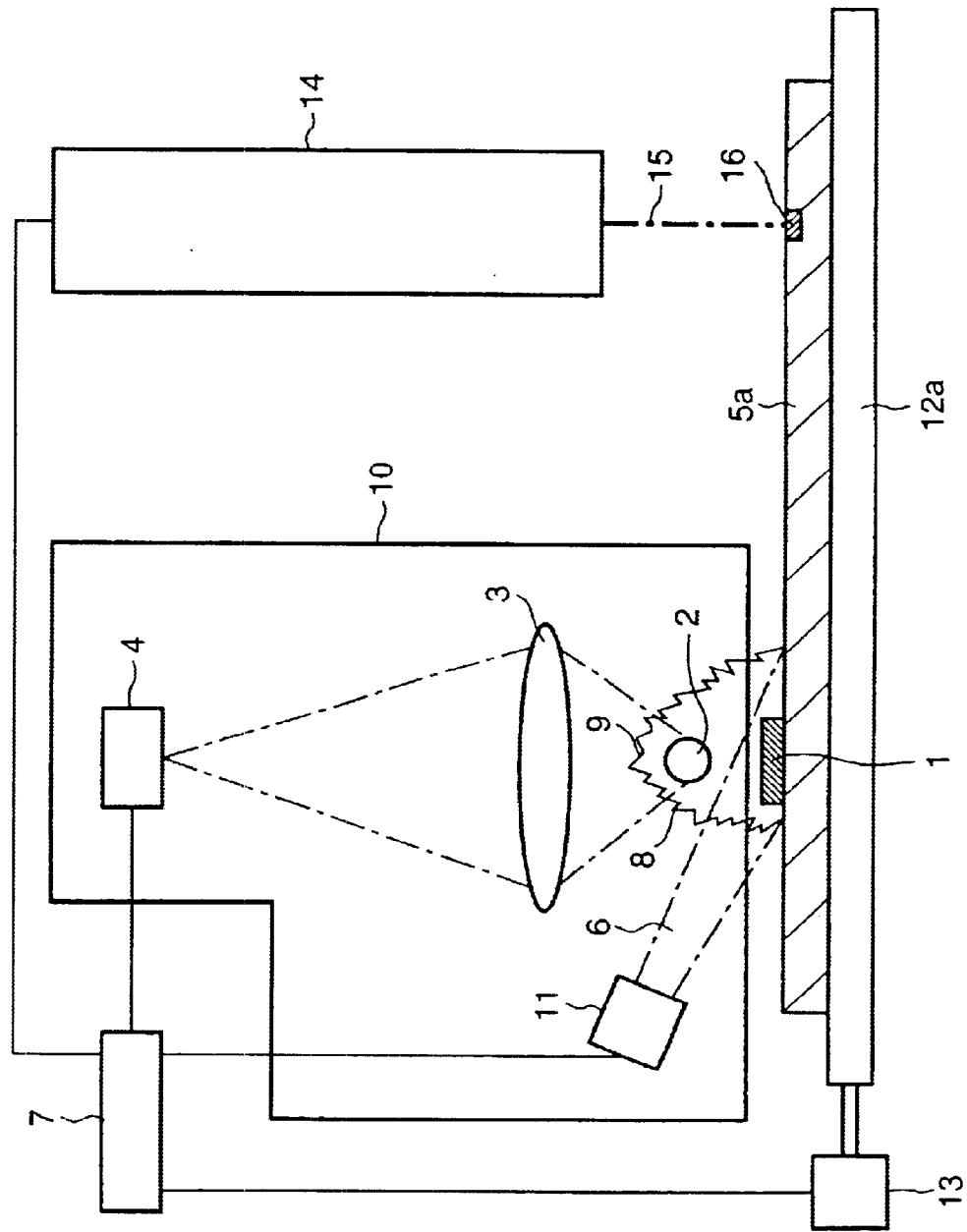
FIG. 2 is a schematic view showing a principal part of the first embodiment of a working tool using the position detection device of the present invention.

FIG. 2 is a schematic view showing a principal part of a micro-working tool (optical working tool) for manufacturing semiconductor elements, micro-worked products, and the like using a focused ion beam (FIB), to which the position detection device of the present invention is applied.

In FIG. 2, a member 5a to be worked is placed on a work stage 12a, which can be driven by the stage drive system 13, and an irradiation means 14 for irradiating a working beam irradiates a working beam 15 onto the member 5a to be worked, thereby forming a pattern 16. In this case, a desired pattern is formed on the member 5a to be worked under the control of the controller 7 which controls the working beams 15, and also performs the entire working position control.

In order to detect the position information of the member 5a to be worked at that time, the near-field optical system 10 made up of the light irradiation means 11 for irradiating pumping light (alignment light) 6 for position detection, probe 2, focusing lens 3, and detector 4 (FIG. 1) is used. The pumping light (illumination light, e.g., wavelength=785 nm) 6 emitted by the light irradiation means 11 is diffracted/scattered or absorbed by the alignment mark 1. The probe 2 interacts with the near field 8 to form a new field (near field). The detector 4 detects scattered light 9 based on near-field light present in such changed near field via the lens 3.

In the first embodiment, light having a wavelength of 785 nm is used as the pumping light 6. In this case, the probe 2 is controlled with precision of 1 nm by shear force control shown in FIG. 3, and detects an image of the cross-shaped alignment mark 1 having a width of 2 nm and length of 50 nm with positional precision of 1 nm.

Figure 3:
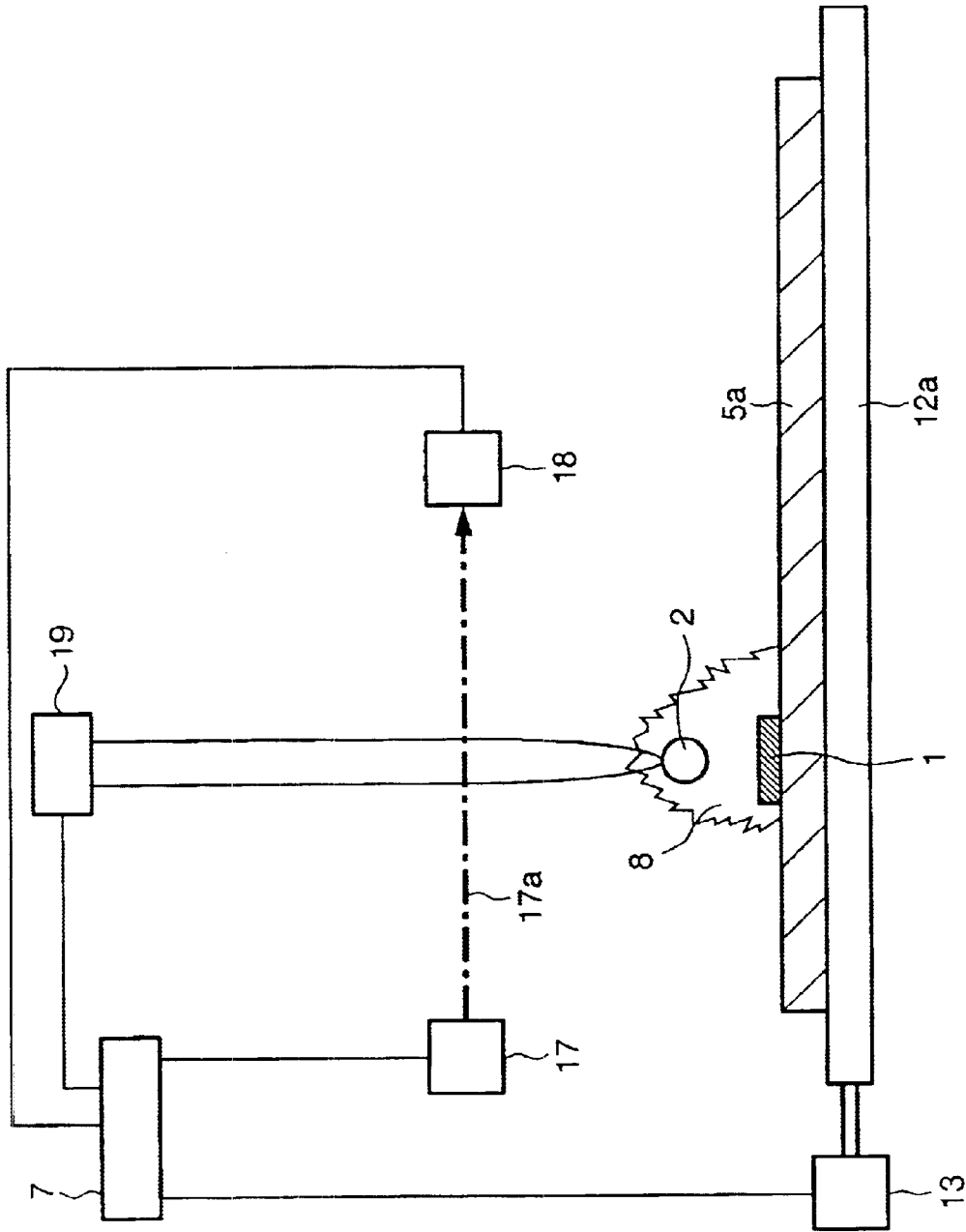
FIG. 3 is an explanatory view of probe control in the first embodiment of the working tool using the position detection device of the present invention.

FIG. 3 is a schematic view showing principal part of a probe control system in this embodiment. The probe control system comprises a light source 17 for emitting detection light 17a for shear force control, a position detector 18 for detecting the incoming position of the detection light 17a, a piezoelectric element 19 for driving the probe, and the controller 7 for controlling driving of the individual elements.

The probe control system shown in FIG. 3, and the near-field optical system 10 shown in FIG. 2 have a three-dimensional layout; these systems are rotated a predetermined angle relative to each other in the back-and-forth direction on the plane of the drawing to have the alignment mark 1 as the center, so that they do not mechanically interfere with each other. As the probe 2, a gold probe tip having a distal end diameter of 10 nm is used. In order to make the distance between the probe 2 and alignment mark 1 constant on the nanometer order, the probe 2 is microscopically vibrated by the piezoelectric element 19 above the alignment mark 1 to control any the deviation of the resonance frequency.

The detection light 17a for shear force control is perpendicularly irradiated onto the probe 2, and light components that have passed through the two ends of the probe 2 are incident on the position detector 18. The vibration of the probe 2 is detected using a signal output from the position detector 18. Note that light coming from an LD (laser diode) having a wavelength of, e.g., 630 nm, is used as the detection light 17a for shear force control, and the position detection system uses a filter (not shown) that transmits only the wavelength of alignment light, thereby achieving a noise reduction for an alignment signal.

In this fashion, the positions of the probe 2 and alignment mark 1 are detected on the nanometer order, and the work stage 12a is driven to a desired position using the stage drive system 13 on the basis of the detection signals, thereby controlling the position of the member 5a to be worked. Then, the working beam 15 is irradiated onto the member 5a to be worked to form a desired pattern (micropattern) on the member 5a to be worked.

Figure 4:
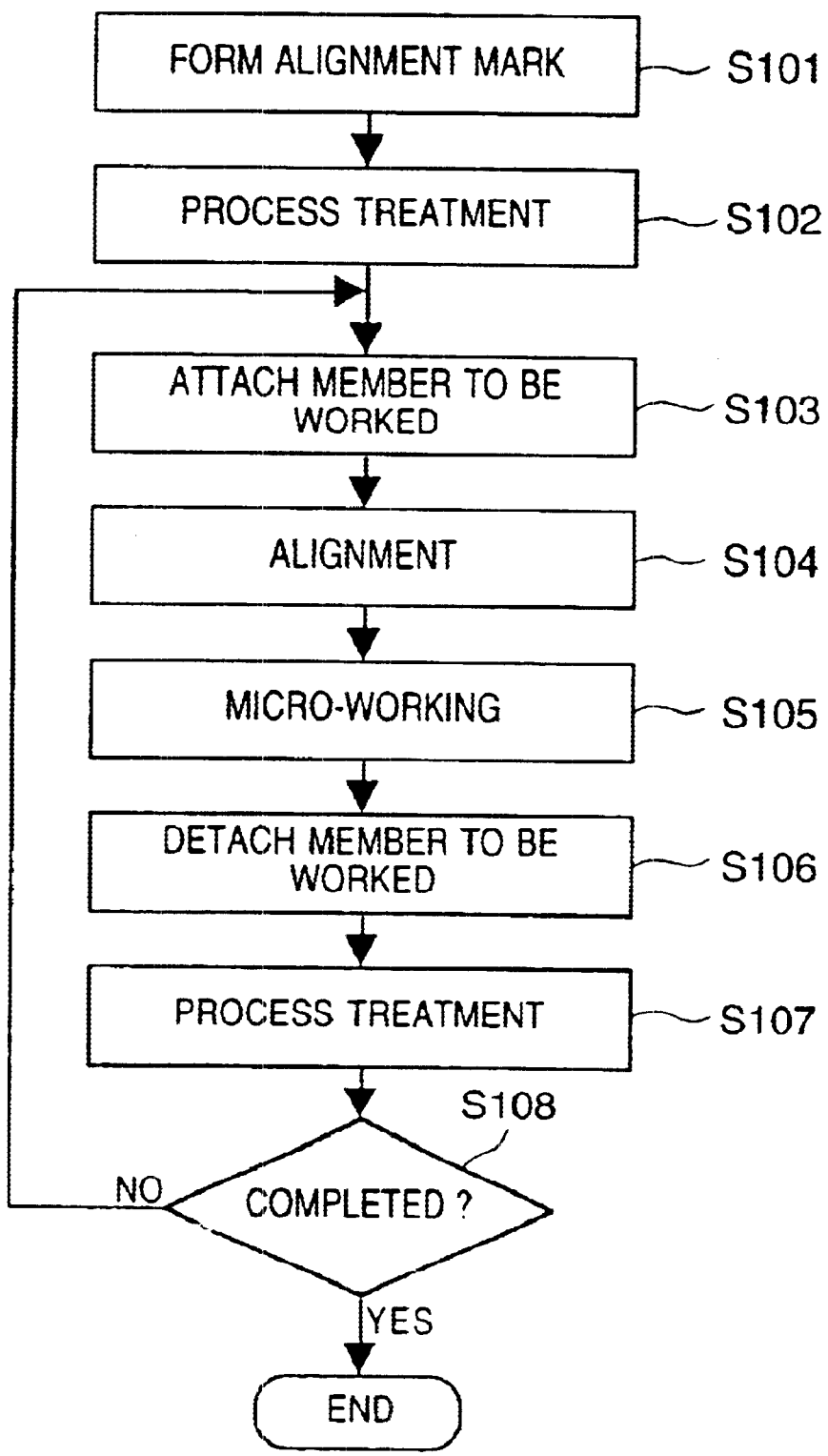
FIG. 4 is a flow chart showing multi-process working in the first embodiment of the working tool using the position detection device of the present invention.

FIG. 4 is a flow chart showing processing for performing micro-working across a plurality of processes in the first embodiment. The alignment mark is formed on the member to be worked according to the first embodiment (step S101). A process treatment using etching or deposition suitable for the alignment mark shape is done (step S102).

The member to be worked is attached onto the work stage (step S103), and is aligned using the alignment mark (step S104). A predetermined pattern is then formed at a predetermined position on the member to be worked by a working beam (step S105).

The member to be worked is removed from the work stage (step S106), and undergoes the next process treatment (step S107). Upon completion of the process treatment, it is checked if the next process treatment to be done remains (step S108). If the next process treatment to be done remains (NO in step S108), the member to be worked is attached onto the work stage again to start the next working.

In this way, adhesion, alignment, working, and process treatment are repetitively performed, and a product having micropatterns obtained via a plurality of desired processes is manufactured.

In the first embodiment, scattered light is detected using the metal probe 2 as one element of the near-field optical system 10. Alternatively, a probe made up of a fiber may be used, and near-field light (scattered light) may be detected from the distal end of the fiber.

Also, a so-called reflected detection light mode for receiving near-field light simultaneously with irradiation of light from a fiber may be used. In the arrangement of the micro-working unit, the first embodiment uses an FIB as a working beam. However, other working beams, e.g., an electron beam and the like may be used.

Figure 5:
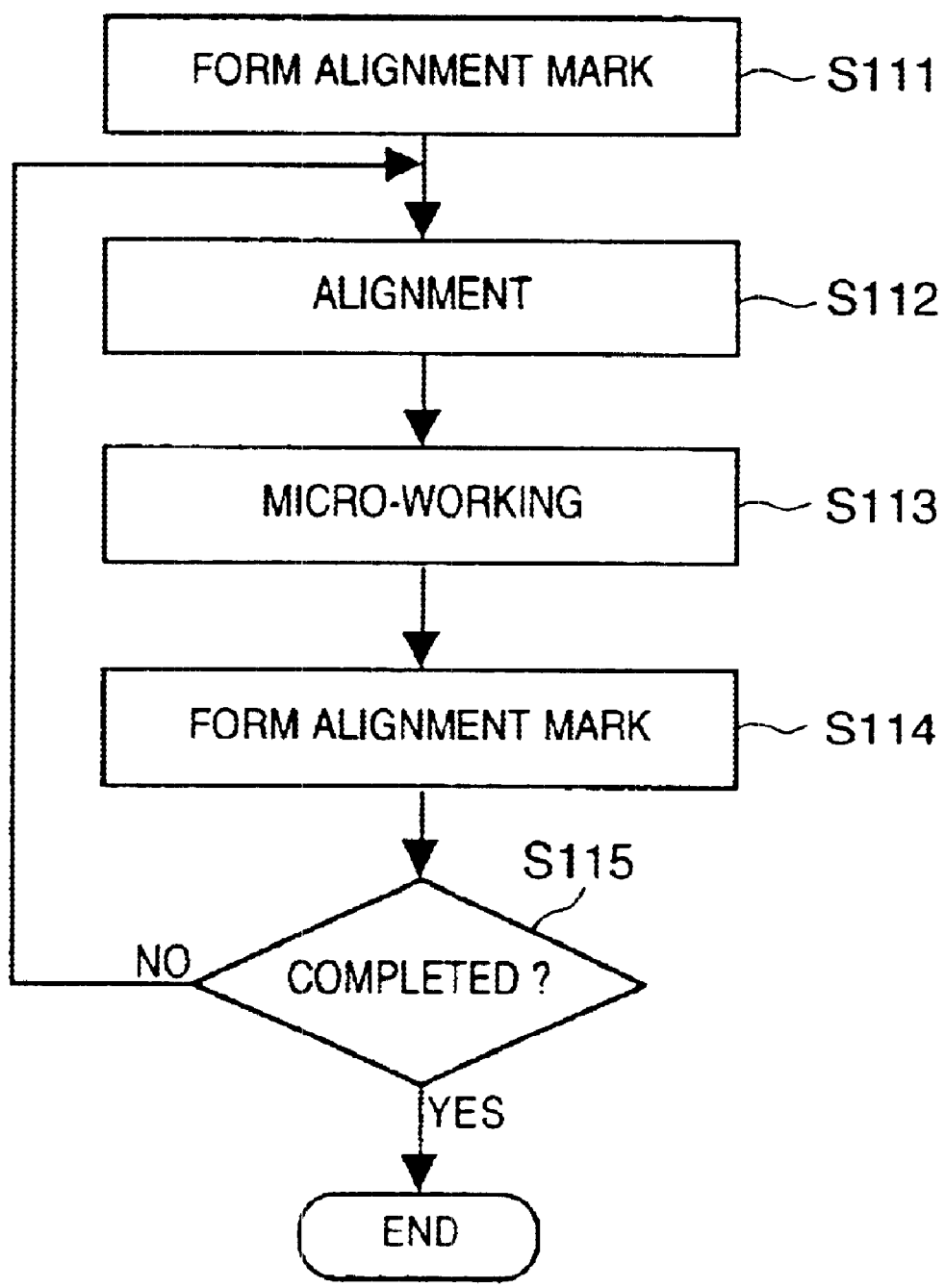
FIG. 5 is a flow chart showing broad-range working in the first embodiment of the working tool using the position detection device of the present invention.

FIG. 5 is a flow chart showing another embodiment of the method of forming the alignment mark in the first embodiment. FIG. 5 shows a case wherein an alignment mark is formed on the member to be worked using the working beam, and alignment is made based on the formed alignment mark so as to work while assuring precise alignment over a broader range region.

In FIG. 5, after the member to be worked is attached onto the work stage, an alignment mark is formed at a predetermined position (step S111). Alignment is made using that alignment mark (step S112).

The work stage is then driven to form a desired pattern at a predetermined position (step S113). After the pattern formation, the next alignment mark is formed on the member to be worked by the working beam (step S114). It is checked if the next desired pattern is to be formed using that alignment mark (step S115). If the next desired pattern is to be formed (NO in step S115), the flow returns to step S112. By repeating the above steps, high-precision working over a broad range can be achieved.

In the first embodiment, in order to calibrate the positions of the alignment mark and working beam, a calibration mark may be formed on the member to be worked using the working beam, and may be detected by the near-field optical system according to the present invention.

Also, a plurality of alignment marks may be formed on the member to be worked, and the position of the entire member to be worked may be determined to work the member by detecting the position information of these marks, thereby improving the alignment precision.

Second Embodiment

Figure 6:
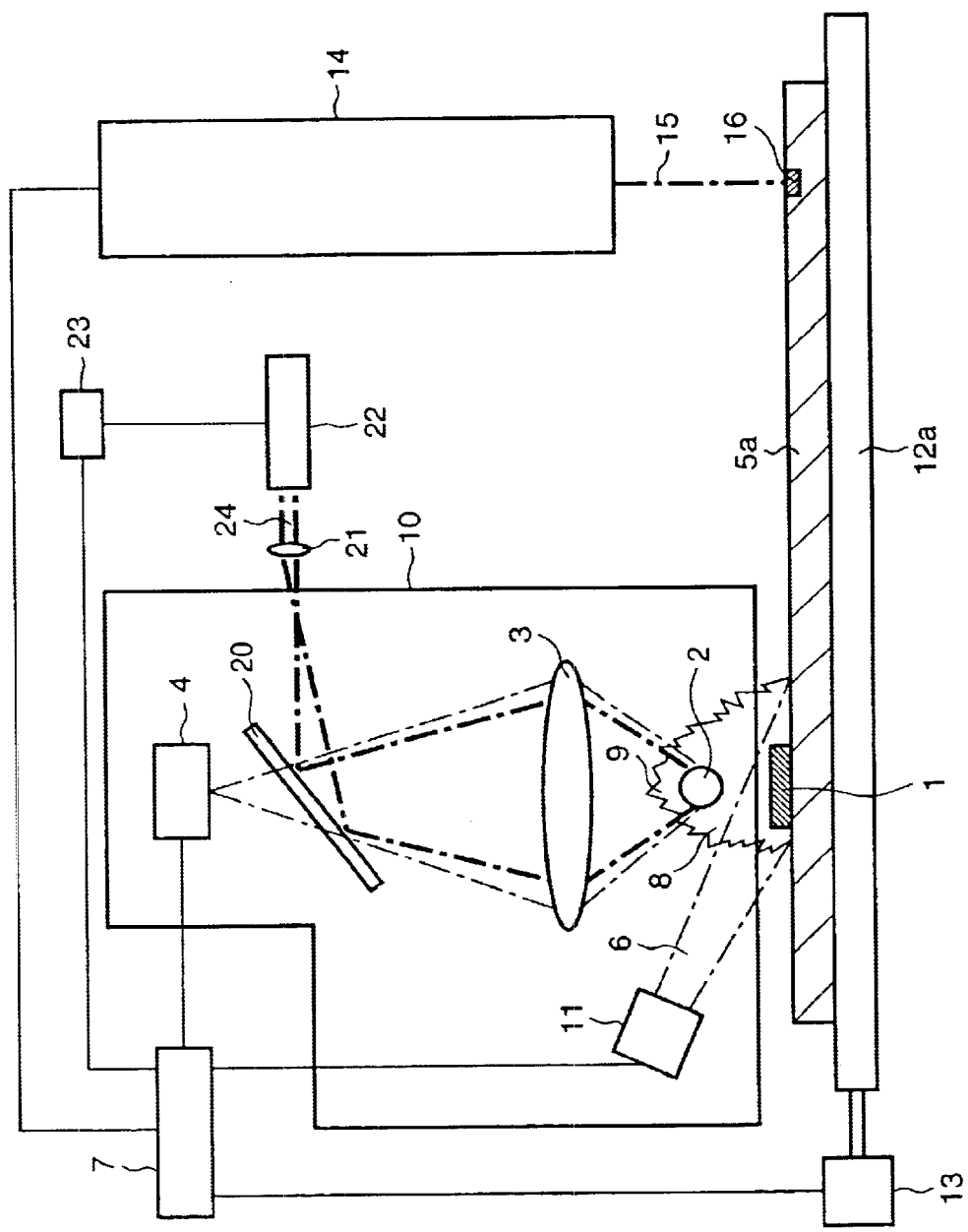
FIG. 6 is a schematic view showing a principal part of the second embodiment of a working tool using the position detection device of the present invention.
Figure 7:
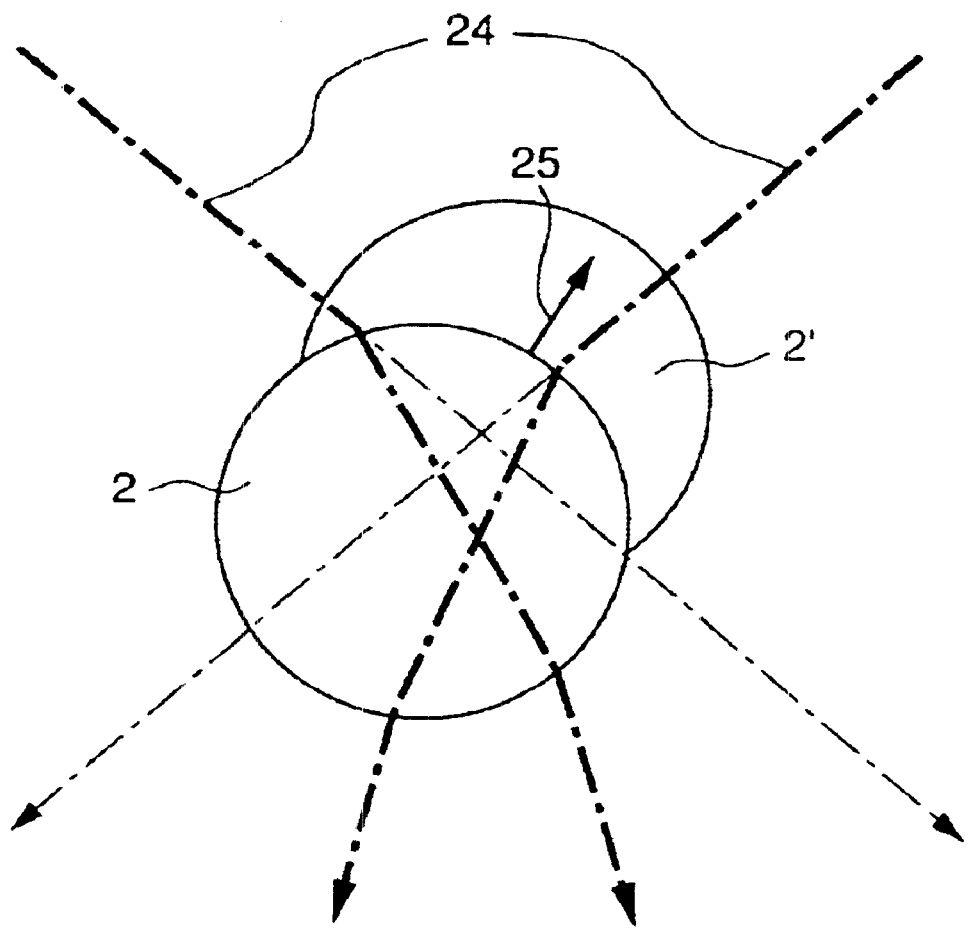
FIG. 7 is an explanatory view of an optical trap in the second embodiment of the working tool using the position detection device of the present invention.

FIG. 6 is a schematic view showing a principal part of the second embodiment of the present invention, and FIG. 7 is a partial explanatory view of FIG. 6. In this embodiment, a probe obtained by optically trapping and controlling a microparticle is used as that used in the first embodiment.

FIG. 7 shows a case wherein an optically trapped microparticle, the position of which is controlled by probe control light (optical trapping light) 24, is used as a probe 2, and is placed in a near field 8 originating from an alignment mark 1 as in the probe of the first embodiment, thus changing the near field. Scattered light 9 due to the near-field light present in the near field 8 is detected by a detector 4 via a lens 3. An optical trapping control system for controlling the position of the probe 2 made up of the microparticle is constituted by an optical trapping light source 22, lens 21, half mirror 20, lens 3, and the like.

As the optical trapping light source 22, for example, an Nd:YAG laser (wavelength=1.06 $\mu$m: 100 mW) is used. The optical trapping light 24 output from the optical trapping light source 22 is focused by the lens 21, and is bent by the half mirror 20. The light 24 is then irradiated onto the probe 2 via the lens 3, which is also commonly used by the near-field optical system 10. As the microparticle of the probe 2, a polystyrene ball having a diameter of 100 nm is used.

FIG. 7 shows the optical trapping light 24 and a direction 25 of the force that acts on the probe 2 consisting of the microparticle. The focused optical trapping light 24 is scattered by the probe 2 made up of the microparticle. The probe 2 itself is attracted toward the center of the beam electric field distribution, i.e., the beam focus position, moves in the direction 25, and stabilizes at the focus position (beam waist).

When the beam waist position is adjusted by a focus position adjustment means (not shown) to be located slightly below the center of the probe 2, the probe 2 is lightly pressed against the surface of the alignment mark 1. As a result, the distance between the probe 2 and the surface of the alignment mark 1 can be kept to be nearly zero.

When a scan at a field size of 100 nm is made by a focus position control means (not shown) using the probe 2, the position of which is controlled in such a way, the position: information of the alignment mark 1 can be obtained with precision on the nanometer order.

Before the member 5a to be worked is roughly set at a predetermined position, the probe 2 stands by at a position slightly above the setting position of the member 5a to be worked under the control of the focus position control means (not shown). Other basic arrangements are the same as those in the first embodiment.

Third Embodiment

Figure 8:
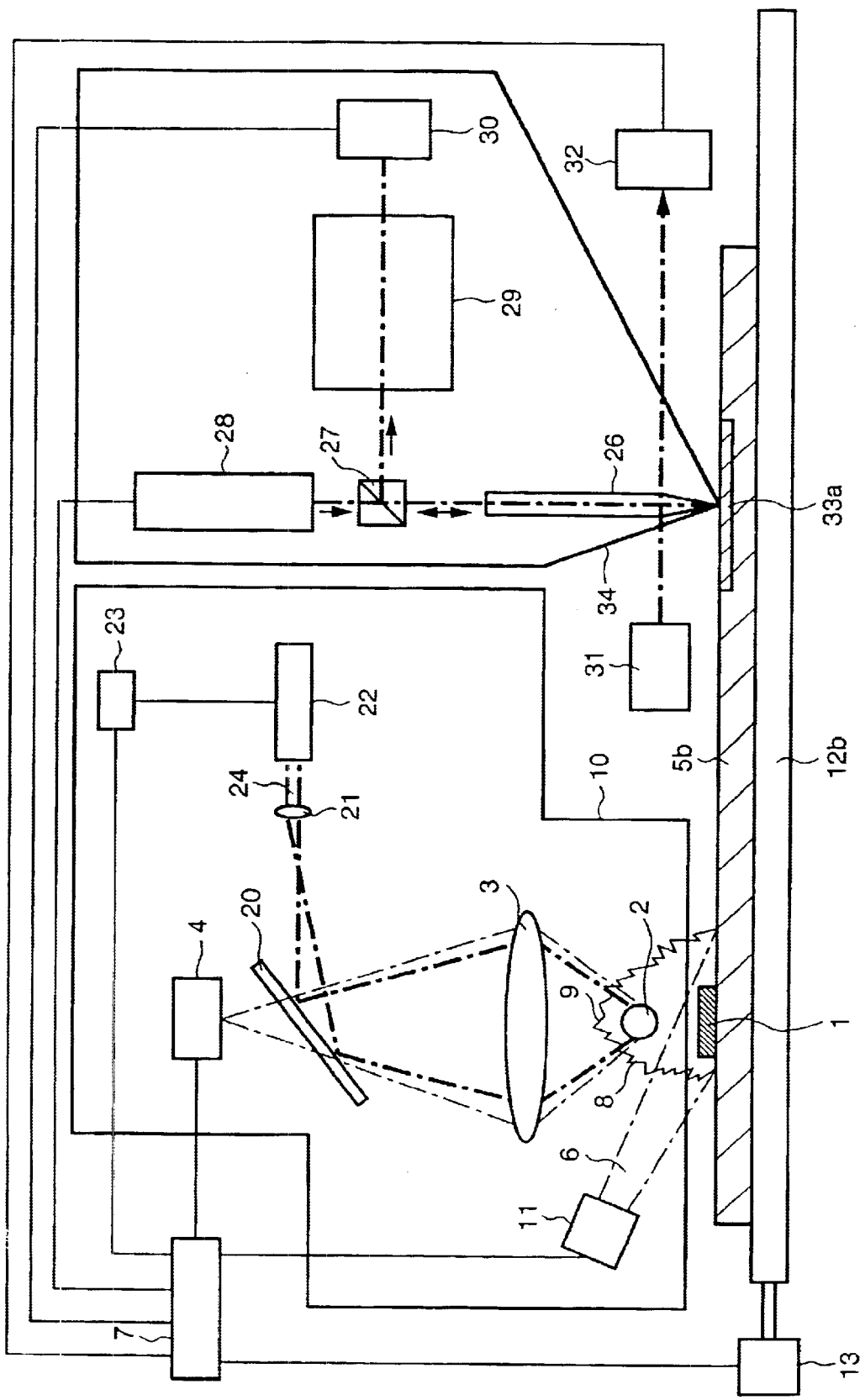
FIG. 8 is a schematic view showing a principal part of the third embodiment of a working tool using the position detection device of the present invention.

FIG. 8 is a schematic view showing a principal part of the third embodiment of the present invention. In the third embodiment, the position detection device is applied to a portion of a near-field fluorescent microscope as a microstructure inspection means.

A specimen 5b to be evaluated with a microstructure is placed on an inspection stage 12b, and its evaluation region 33 is inspected using an inspection unit 34. In this case, in order to inspect the predetermined position of the evaluation region 33a, an alignment mark 1 formed on the specimen 5b to be evaluated is detected using a position detection device 10. Based on the detection result, a stage drive system 13 moves the inspection stage 12b under the control of a controller 7 to inspect the specimen.

The structure of the position detection device for precisely aligning the specimen 5b to be evaluated with the microstructure to a predetermined position is the same as that in the second embodiment.

On the other hand, the inspection unit 34 has an inspection light source 28, a fiber probe 26 for microstructure evaluation, which irradiates a beam output from the inspection light source 28 onto the specimen 5b to be evaluated as near-field light via a half mirror 27, the half mirror 27 for guiding luminescence produced from the evaluation region 33a to a detection system, a spectroscope 29 for evaluating the spectrum of the luminescence, and a detector 30 for detecting the spectrum.

Note that the fiber probe 26 for microstructure evaluation is controlled by a shear force detection system (a light source 31 and detector 32 therefor) having the same arrangement as that described in the first embodiment.

According to the third embodiment, luminescent microspectroscopy can be made on the nanometer order, and the microstructure of the specimen to be evaluated can be inspected on the nanometer order. As for formation of the alignment mark 1 on the specimen 5b to be evaluated with the microstructure, if the specimen 5b to be evaluated is, e.g., a biological specimen, a substrate on which an alignment mark is formed before formation of a specimen is prepared in advance, and the specimen is formed thereon. On the other hand, if the specimen 5b to be evaluated is a specimen for evaluating a structural member in the manufacture of semiconductor elements, the alignment mark may be formed simultaneously with formation of the specimen.

Also, the near-field luminescence microscope system is used as the microstructure inspection means. However, the present invention can be similarly applied to apparatuses using various microstructure inspection means on the nanometer order such as inspection using an electron beam, a scanning tunneling microscope (STM), an atomic force microscope (APM), and the like.

As described above, according to the first to third embodiments, the position detection device, which brings the probe close to a near field formed on the object surface upon irradiation of pumping light onto the alignment mark formed on the object surface, and detects scattered light based on near-field light obtained at that time to detect the position information of the object with high precision, and which is suitable for a micro-working tool for manufacturing semiconductor elements, a microstructure inspection tool for inspecting the microstructure on the object surface, and the like, and a working tool using the same, can be achieved.

Especially, an image which has a resolution as low as the wavelength order upon detecting an alignment mark by a conventional system can be obtained to have a resolution as high as 1/100 or less the wavelength, i.e., the nanometer order, by building a near-field optical system, and subnanometer position detection can be realized.

When the position detection device of the present invention is mounted on a micro-working took, a device with a complicated structure can be worked on the nanometer order.

Also, when the position detection device of the present invention is mounted on a microstructure inspection apparatus, a microstructure on the nanometer order can be accurately measured.

Fourth Embodiment

In the fourth embodiment, the position detection device of the first embodiment mentioned above is used in an exposure apparatus, and the individual components of that position detection device constitute a fine alignment system. The resolution of the fine alignment system is determined by the size of a small object (probe) to be brought close independently of the wavelength of light, and the system can resolve even an object much smaller than the wavelength.

In the fourth embodiment, the position information of the object is detected with subnanometer precision using this fine alignment system and a pre-alignment system that feeds the object within the position detectable range of the fine alignment system, and the object is aligned with high precision by the position detection device having these alignment systems.

In the fourth embodiment, prior to the position detection by the fine alignment system shown in FIG. 1, an object is pre-aligned by the pre-alignment system (not shown) using a conventional optical image processing method, so that an alignment mark falls within the measurement range (position detectable range) of the fine alignment system, and the object is moved in advance by a stage drive system 13.

In the fourth embodiment, when the aligned object to be exposed is exposed using exposure light by a known method, a micropattern on the nanometer order is formed.

Figure 9:
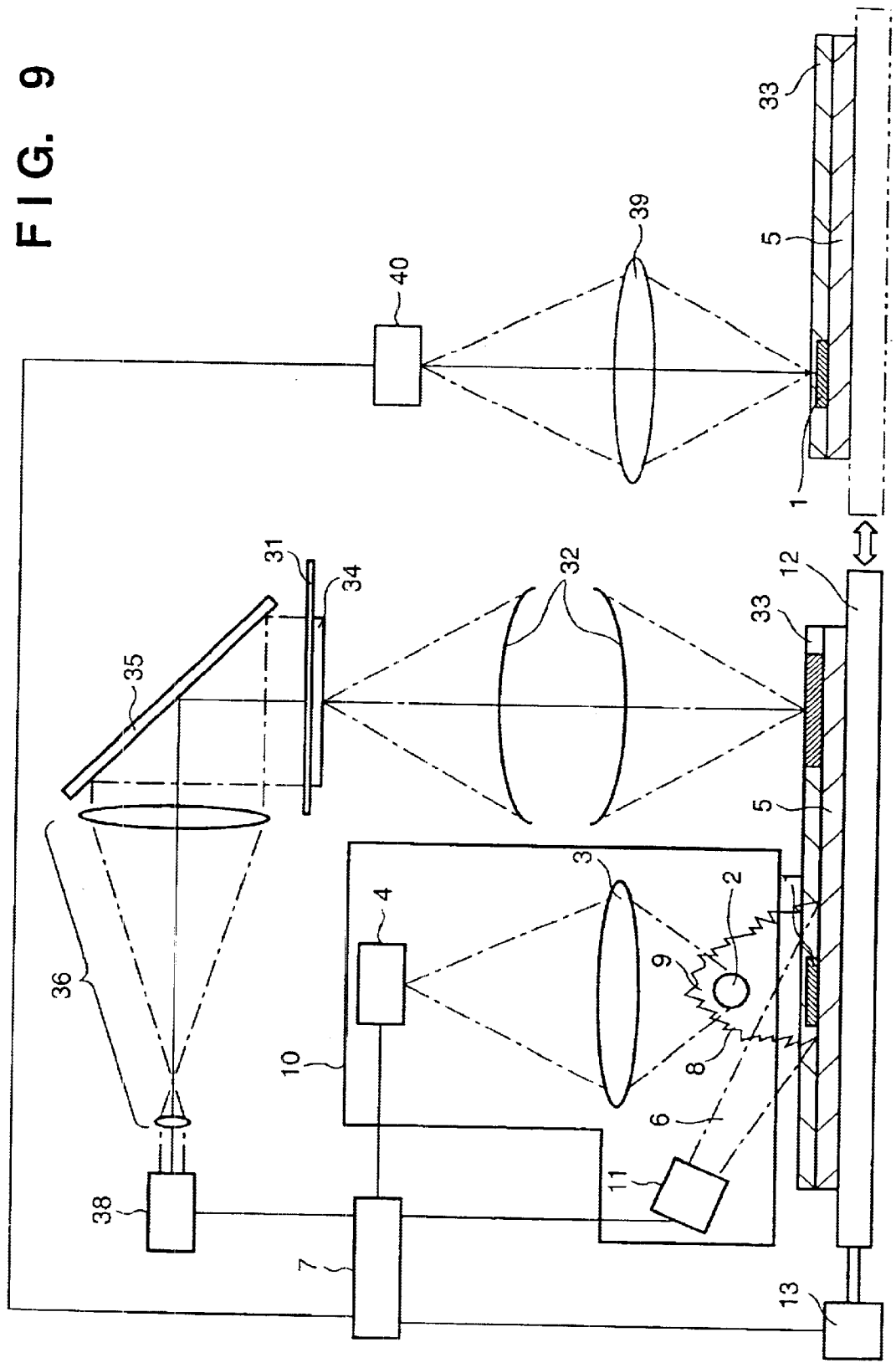
FIG. 9 is a schematic view showing a principal part of the fourth embodiment of an exposure apparatus according to the present invention.

FIG. 9 is a schematic view showing a principal part of the fourth embodiment of a step-and-repeat or step-and-scan exposure apparatus (projection exposure apparatus) to which the position detection device with the fine alignment system shown in FIG. 1 is applied, and which is used for manufacturing devices.

A wafer (object to be exposed) 5 applied with a resist 33 is placed on a wafer stage 12 which is movable by the stage drive system 13, and is pre-aligned at a pre-alignment position. The pre-alignment system has a lens 39 and detector 40. The detector 40 detects an image of an alignment mark 1 formed on the surface of the wafer 5, and the stage drive system 13 controls driving of the wafer stage 12 under the control of a controller 7 based on the detected data, so that the alignment mark 1 is located at a predetermined position.

The stage drive system 13 drives the wafer stage 12 to move the wafer 5 using a stage interferometer (not shown) so that the alignment mark 1 formed on the wafer 5 falls within the measurement range of a near-field optical system 10 of the fine alignment system. The position of the alignment mark 1 is detected by the fine alignment system.

In order to detect the position information of the wafer 5 at that time, the near-field optical system 10 made up of a light irradiation means 11 for irradiating pumping light (alignment light) 6 for position detection, probe 2, focusing lens 3, and detector 4 (FIG. 1) is used. The pumping light (illumination light, e.g., wavelength=1,550 nm) 6 emitted by the light irradiation means 11 is diffracted/scattered or absorbed by the alignment mark 1. The probe 2 interacts with the near field 8 to form a new field (near field). The detector 4 detects scattered light 9 based on near-field light present in such a changed near field via the lens 3.

The near-field optical system 10 in the fourth embodiment can detect the position of the alignment 1 at a resolution on the nanometer order much shorter than the wavelength of the pumping light 6 using the wavelength of the pumping light 6.

In the fourth embodiment, the thickness of the resist 33 is about 1 $\mu$m, and light (pumping light) having a wavelength longer than the resist thickness is used as alignment light, so that the near-field region from the alignment mark 1 underneath the resist 33 can spread to the vicinity of the resist surface.

In the fourth embodiment, the probe 2 is controlled with a precision of 1 nm by the shear force control method of the first embodiment shown in FIG. 3, and detects an image of the alignment mark 1 (in, e.g., FIGS. 10A and 10B) with a positional precision of 1 nm. Positional deviation is controlled with a precision of 1 nm.

Figure 10A:
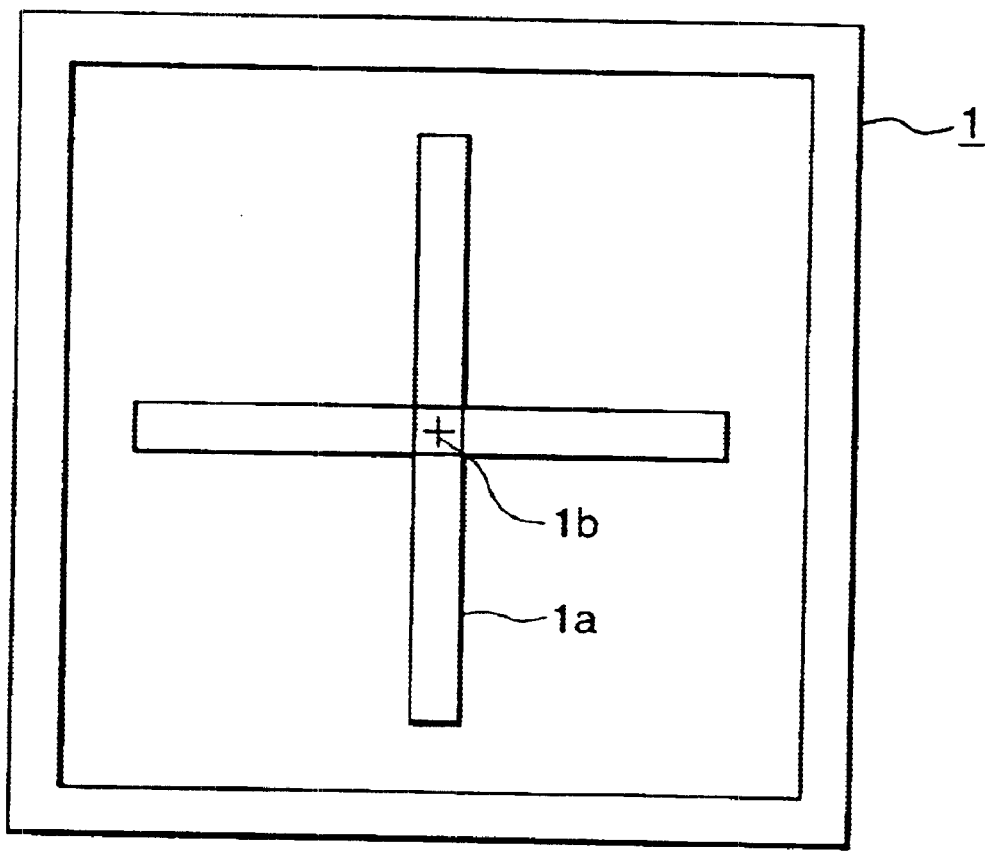
FIGS. 10A and 10B are explanatory views of an alignment mark shown in FIG. 9.
Figure 10B:
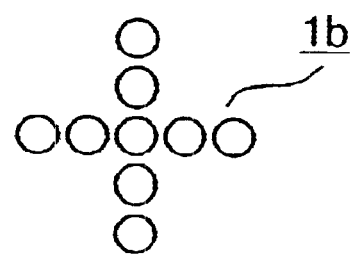

FIG. 10A is an explanatory view of the alignment mark 1 used at that time. A 2-μm wide cross mark 1a is formed at the center of a 20 μm×20 μm square, and a 150-nm long, cross-shaped dot pattern 1b is formed at the center of the cross mark 1a. The pre-alignment uses the large cross pattern 1a, and fine alignment uses the dot pattern 1b at the center of the mark. FIG. 10B shows the central dot pattern 1b in an enlarged scale.

In this way, the positions of the probe 2 and alignment mark 1 are detected on the nanometer order, and the wafer stage 12 is driven using the stage drive system 13 based on the detection signals, thus controlling the position of the wafer 5. Upon irradiating exposure light onto the wafer 5, a desired pattern (micropattern) is formed on the surface of the wafer 5.

Referring back to FIG. 9, reference numeral 38 denotes an excimer laser; and 36, a beam expander, which expands a laser beam (exposure light) originating from the excimer laser 38 and outputs it as a collimated light beam. Reference numeral 35 denotes a mirror which reflects exposure light coming from the beam expander 36 toward a reticle 31. Reference numeral 31 denotes a reticle, on the surface of which a pattern 34 to be transferred onto the wafer 5 is formed.

Reference numeral 32 denotes a projection lens which projects the pattern 34 on the surface of the reticle 31 illuminated with exposure light coming from the excimer laser 38 onto the resist 33 on the surface of the wafer 5 in a reduced scale, thus forming the pattern.

In the projection exposure of the fourth embodiment, the pattern 34 on the surface of the reticle 31 is sequentially formed on the surface of the wafer 5 by the step-and-repeat or step-and-scan method.

Figure 11:
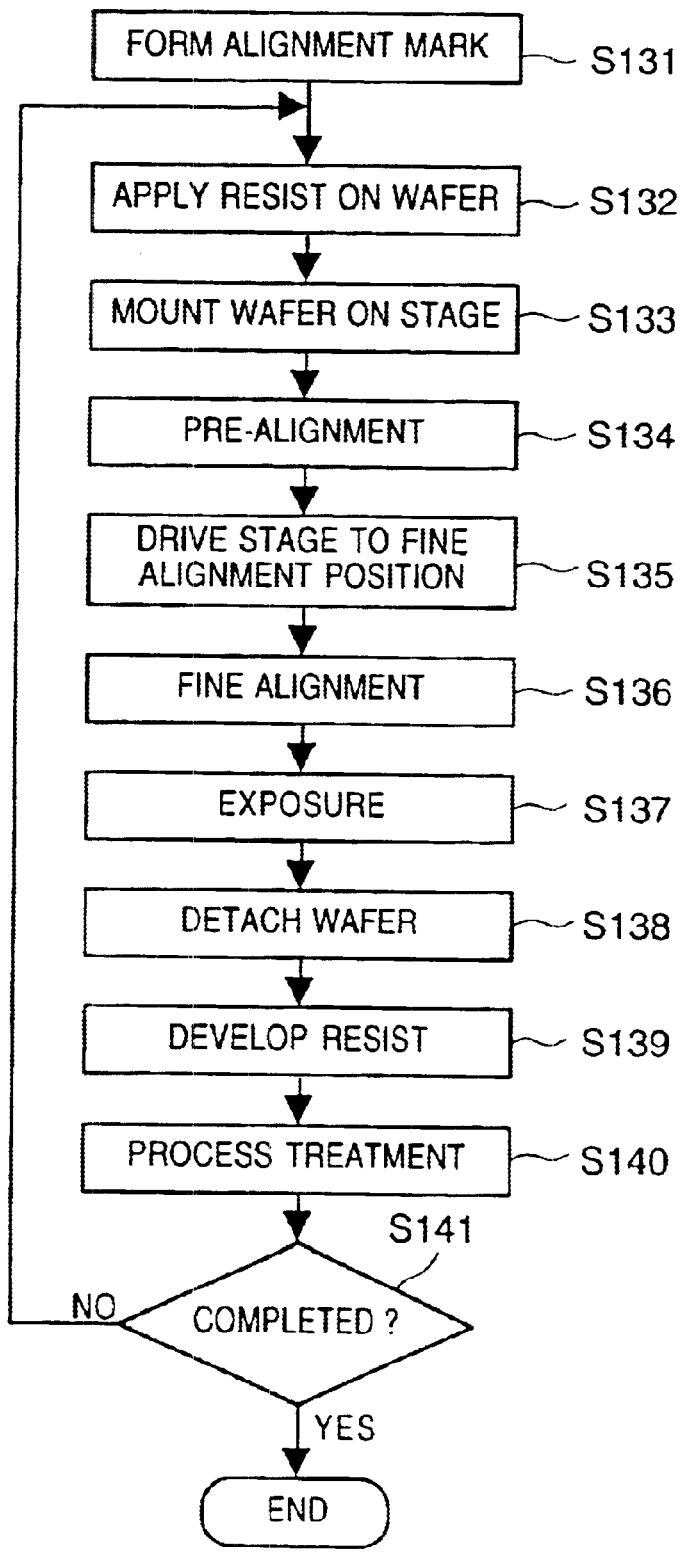
FIG. 11 is a flow chart showing the exposure process in the fourth embodiment of the present invention.

FIG. 11 is a flow chart showing the operations from alignment until exposure in the fourth embodiment.

In FIG. 11, an alignment mark is formed at a predetermined position on the wafer (step S131). A resist is applied onto the wafer (step S132), and the wafer is mounted on the stage (step S133). At the pre-alignment position, pre-alignment is made (step S134). The stage is then driven to detect the position of the wafer using the fine alignment system (step S135). At the fine alignment position, fine alignment is made (step S136). Exposure light is then irradiated onto the wafer to form a desired pattern (step S137). Upon completion of pattern formation, the wafer is detached (step S138). The exposed wafer is developed to form the pattern (step S139). The developed wafer undergoes a process treatment including etching, ion implantation, film formation, and the like (step S140). After the process treatment, it is checked if the next desired pattern is to be formed (step S141). If the next desired pattern is to be formed (YES in step S141), the flow returns to step S132. On the other hand, if no next desired pattern to be formed is present (NO in step S141), the processing ends.

In the fourth embodiment, scattered light is detected using the metal probe 2 as one component of the near-field optical system 10. Alternatively, a probe made up of a fiber may be used, and near-field light (scattered light) may be detected from the distal end of the fiber.

Also, a so-called reflected detection light mode for receiving near-field light simultaneously with irradiation of light from a fiber may be used.

Furthermore, a so-called global alignment system which determines the position of the entire exposure shot by detecting position information of a plurality of alignment marks formed on the wafer surface or the stage (substrate) may be used. With this system, alignment precision can be improved.

Fifth Embodiment

Figure 12:
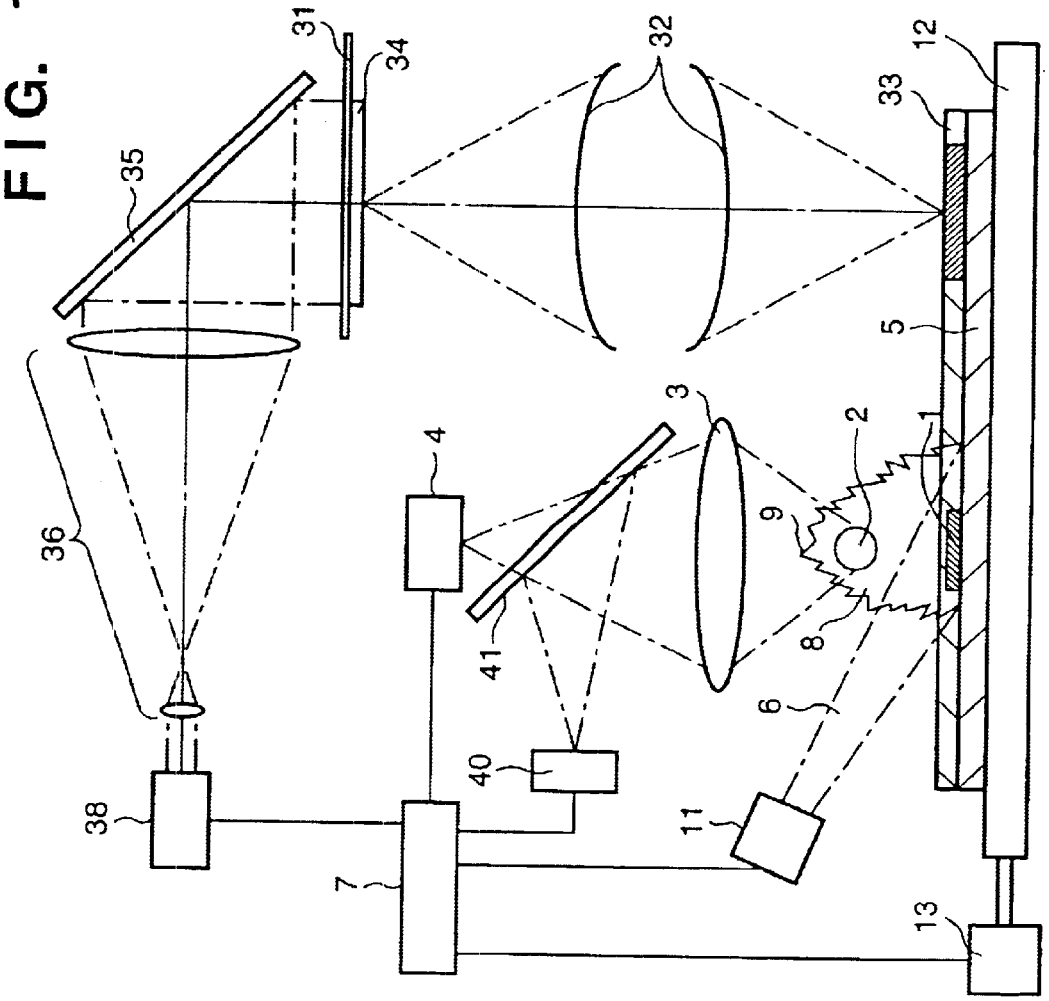
FIG. 12 is a schematic view showing a principal part of the fifth embodiment of an exposure apparatus according to the present invention.

FIG. 12 is a schematic view showing a principal part of the fifth embodiment of the present invention. The arrangement of the fifth embodiment is substantially the same as that of the fourth embodiment shown in FIG. 9, except that some common components are used in the pre-alignment and fine alignment systems to allow the two systems to simultaneously perform measurements.

More specifically, in the fifth embodiment, an objective lens 3 is commonly used in the two systems, and a light beam based on an alignment mark 1 is detected by a detector 40 via a half mirror 41. Also, near-field light in the vicinity of the alignment mark 1 is detected by a detector 4 of the fine alignment system. Other arrangements are the same as those in the fourth embodiment.

Sixth Embodiment

Figure 13:
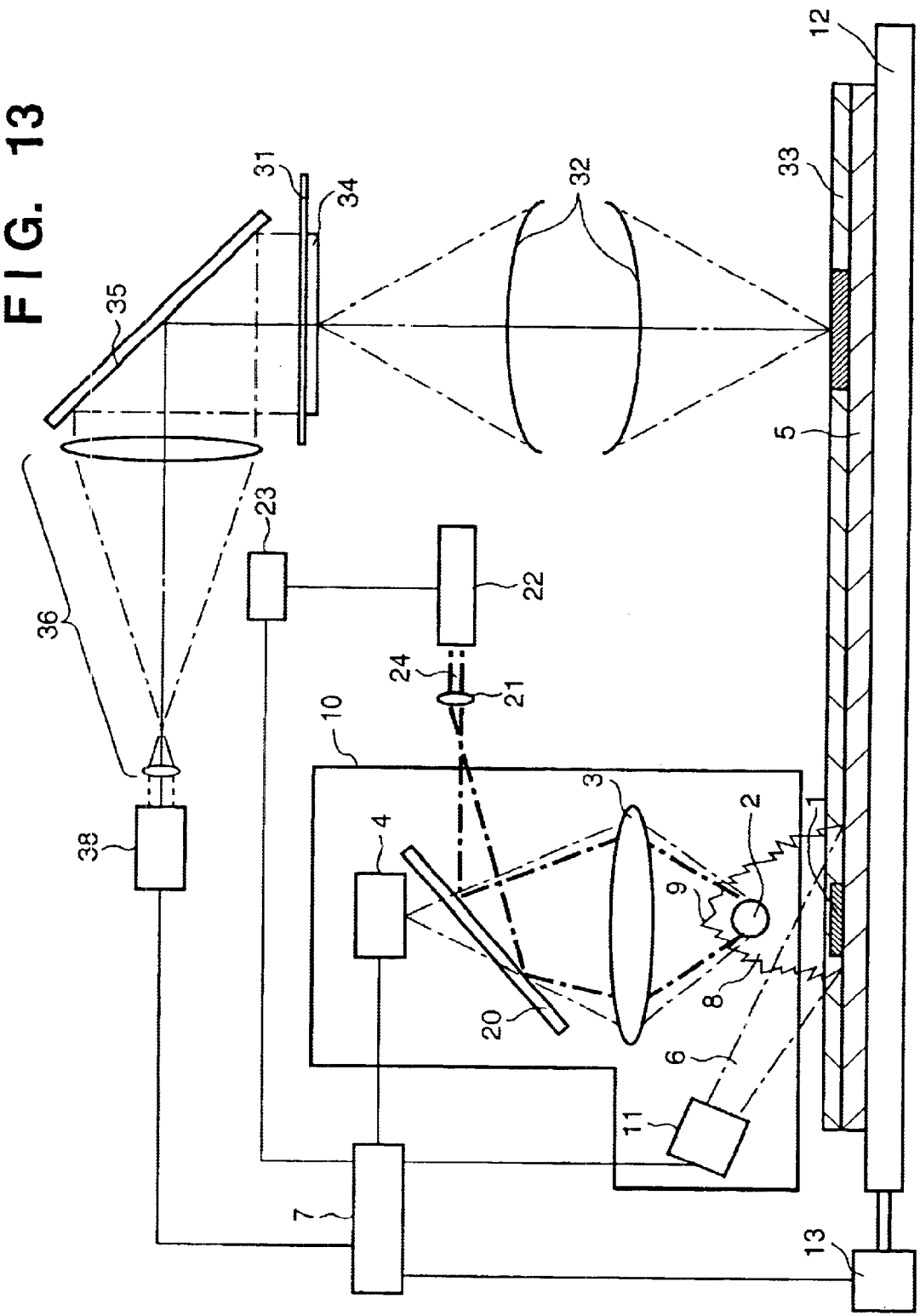
FIG. 13 is a schematic view showing a principal part of the sixth embodiment of an exposure apparatus according to the present invention.

FIG. 13 is a schematic view showing a principal part of the sixth embodiment of the present invention. Note that the same reference numerals in FIG. 13 denote the same parts as in the fourth embodiment shown in FIG. 9.

The sixth embodiment uses a microparticle, which is optically trapped and controlled, as a probe used in the fourth embodiment. Note that the optical trapping optical system for controlling the microparticle is the same as that shown in FIGS. 7 and 8 in the first embodiment described above, and a detailed description thereof will be omitted.

Seventh Embodiment

Figure 14:
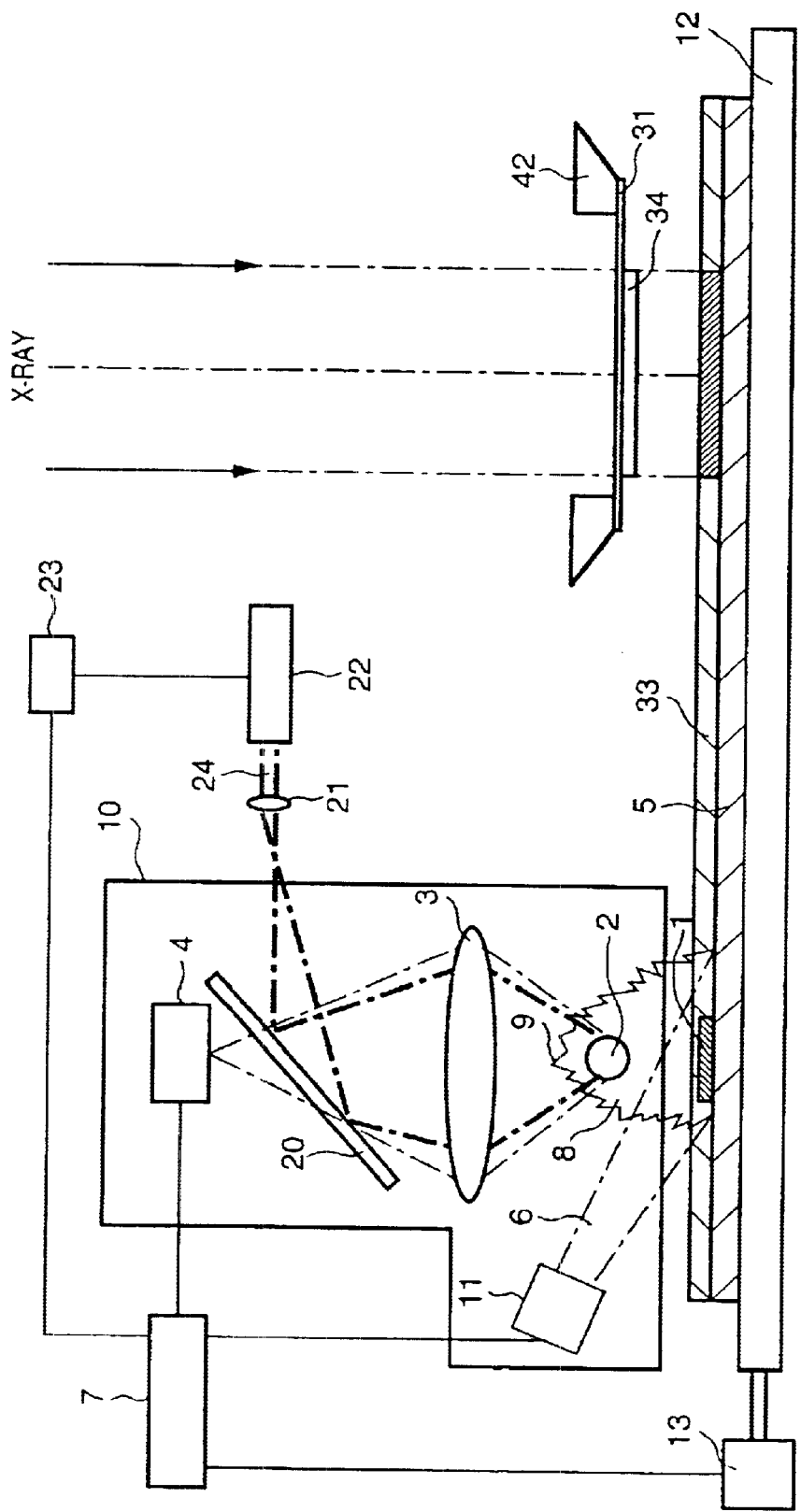
FIG. 14 is a schematic view showing a principal part of the seventh embodiment of an exposure apparatus according to the present invention.

FIG. 14 is a schematic view showing a principal part of the seventh embodiment of the present invention. The fine alignment system and pre-alignment system used in the seventh embodiment are the same as those in the sixth embodiment shown in FIG. 13.

In the seventh embodiment, the present invention is applied to an X-ray proximity exposure apparatus using X-rays. In the seventh embodiment, the position detection method and detection precision of an alignment mark 1 by a near-field optical system 10 are the same as those of the fine alignment system of the sixth embodiment shown in FIG. 13.

In the seventh embodiment, alignment irradiation light having a wavelength of 830 nm coming from a light irradiation means 11 is used. The thickness of a resist 33 is about 0.5 μm, and light having a wavelength longer than the resist thickness is used as alignment light, so that the near-field region from the alignment mark 1 beneath the resist 33 can spread to the vicinity of the resist surface In this case, a probe 2 uses a microparticle which is optically trapped and controlled, as in the sixth embodiment. The control for the probe 2 and the fine alignment system are the same as those in the sixth embodiment.

The fine alignment system uses a so-called global alignment system which obtains the optimal stage drive position for each exposure shot position on the basis of position information of alignment marks formed at eight positions on a wafer 5, and feeds the wafer to each exposure position with stage precision. A mask pattern 34 and the exposure apparatus are aligned by a mask alignment system (not shown).

Upon completion of fine alignment, exposure is performed. As exposure light, X-rays emitted by a synchrotron are used. The wavelength used falls within the range from 7 to 13 Å. The X-rays are designed to uniformly illuminate an exposure field angle of 50 nm via an x-ray mirror system (not shown). Exposure is done for 0.5 sec per shot. A pattern 34 consisting of a tungsten absorbing member is formed on a 2-μm thick SiC mask membrane 31 attached to a mask frame 42. The gap between the mask pattern 34 and wafer 5 is controlled to 10 μm by a gap control system (not shown) to attain proximity exposure. After that, the wafer is subjected to a known development treatment to manufacture a device.

Eighth Embodiment

Figure 15:
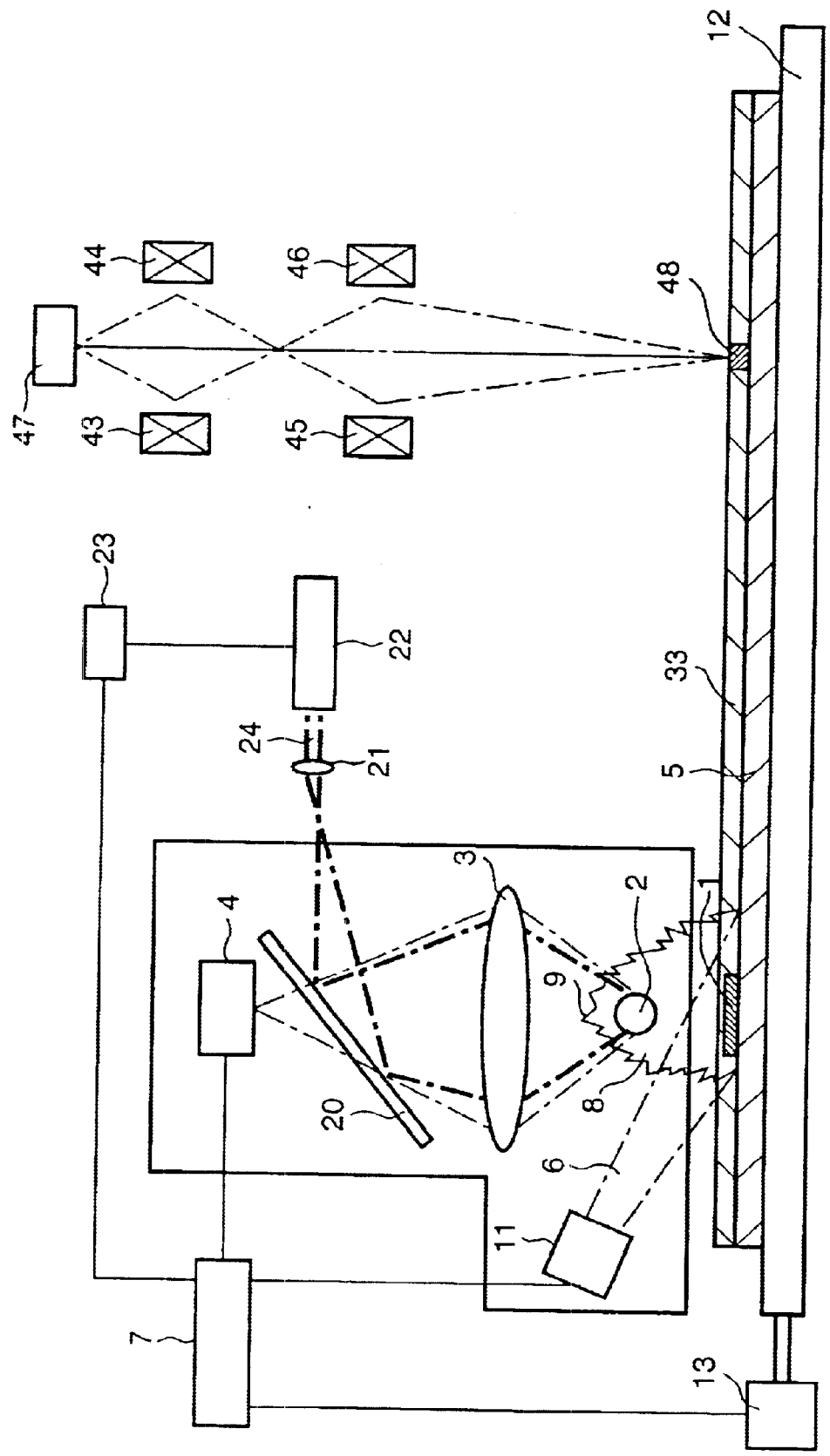
FIG. 15 is a schematic view showing a principal part of the eighth embodiment of an exposure apparatus according to the present invention.

FIG. 15 is a schematic view showing a principal part of the eighth embodiment of the present invention. The fine alignment system and pre-alignment system used in the eighth embodiment are the same as those in the sixth embodiment shown in FIG. 13.

In the eighth embodiment, the present invention is applied to an electron beam (EB) exposure apparatus using an EB.

Also, in the eighth embodiment, the position detection method and detection precision of an alignment mark 1 by a near-field optical system 10 are the same as those of the fine alignment system of the sixth embodiment shown in FIG. 13.

In the eighth embodiment, alignment irradiation light having a wavelength of 785 nm coming from a light irradiation means 11 is used. The thickness of a resist 33 is about 0.4 μm, and light having a wavelength longer than the resist thickness is used as alignment light, so that the near-field region from the alignment mark 1 below the resist 33 can spread to the vicinity of the resist surface.

In this case, a probe 2 uses a microparticle which is optically trapped and controlled, as in the sixth embodiment. The control for the probe 2 and the fine alignment system are the same as those in the sixth embodiment.

The fine alignment system performs so-called global alignment which obtains the optimal stage drive position for each exposure shot position on the basis of position information of alignment marks formed at eight positions on a wafer 5, and feeds the wafer to each exposure position with stage precision.

Upon completion of fine alignment, exposure is made using an EB. An EB emitted by an EB light source 47 forms an exposure spot 48 at a predetermined position on the resist 33 via electron lenses 43, 44, 45, and 46, thus exposing the resist portion in that region. Upon receiving an instruction for forming a predetermined exposure pattern on the wafer from an electron beam control system (not shown), the electron lenses 43, 44, 45, and 46 operate to form the corresponding beam. Upon completion of EB exposure, the wafer is subjected to a known development treatment to manufacture a device.

In the fourth to eighth embodiments described above, the wafer used mainly consists of Si. Alternatively, a wafer consisting of GaAs as a major component or a glass transparent substrate may be used, and exposure can be done irrespective of the materials of wafers.

The exposure apparatus can manufacture a BO (Binary Optics) device (microstructural device). In the case of the wafer consisting of a transparent substrate, alignment pumping light can be irradiated onto the alignment mark from the interior of the transparent substrate in a total reflection state As described above, according to the fourth to eighth embodiments, an exposure apparatus, which brings the probe close to a near field formed on the object surface upon irradiation of pumping light onto the alignment mark formed on the object surface, and detects scattered light based on near-field light obtained at that time to detect the position information of the object with high precision, and which is suitable for a micro-working tool for manufacturing devices such as semiconductor devices, and a device manufacturing method using the same, can be achieved.

Especially, an image which has a resolution as low as the wavelength order upon detecting an alignment mark by a conventional system can be obtained to have a resolution as high as 1/100 or less the wavelength, i.e., the nanometer order, by building a near-field optical system, and subnanometer position detection can be realized. Also, when such a system is used in the exposure apparatus, highly integrated devices can be manufactured.

Also, microstructural devices with complicated structures can be easily worked on the nanometer order.

Ninth embodiment

Figure 16:
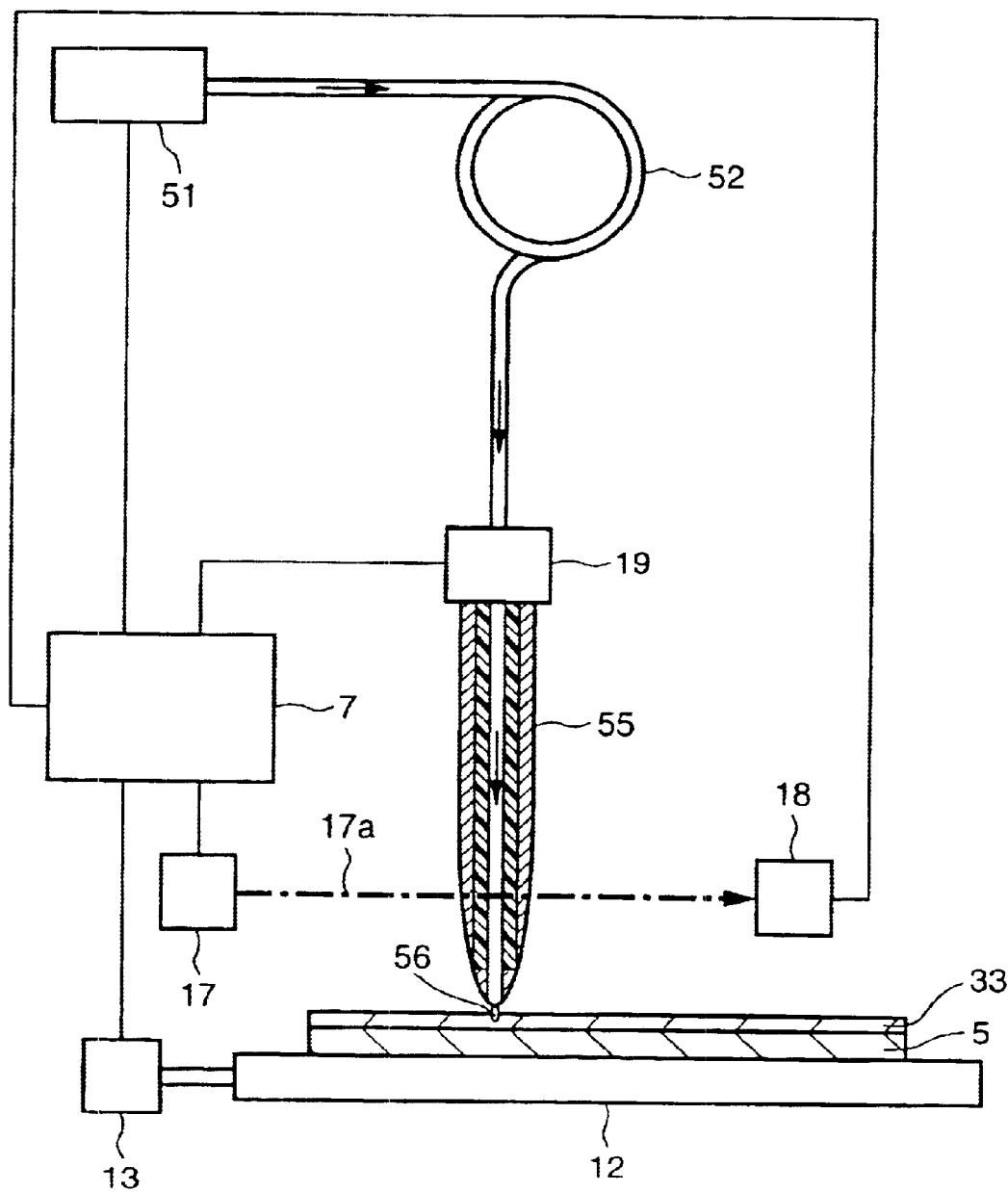
FIG. 16 is a schematic view showing a principal part of the exposure principle of the ninth embodiment of the present invention.
Figure 17:
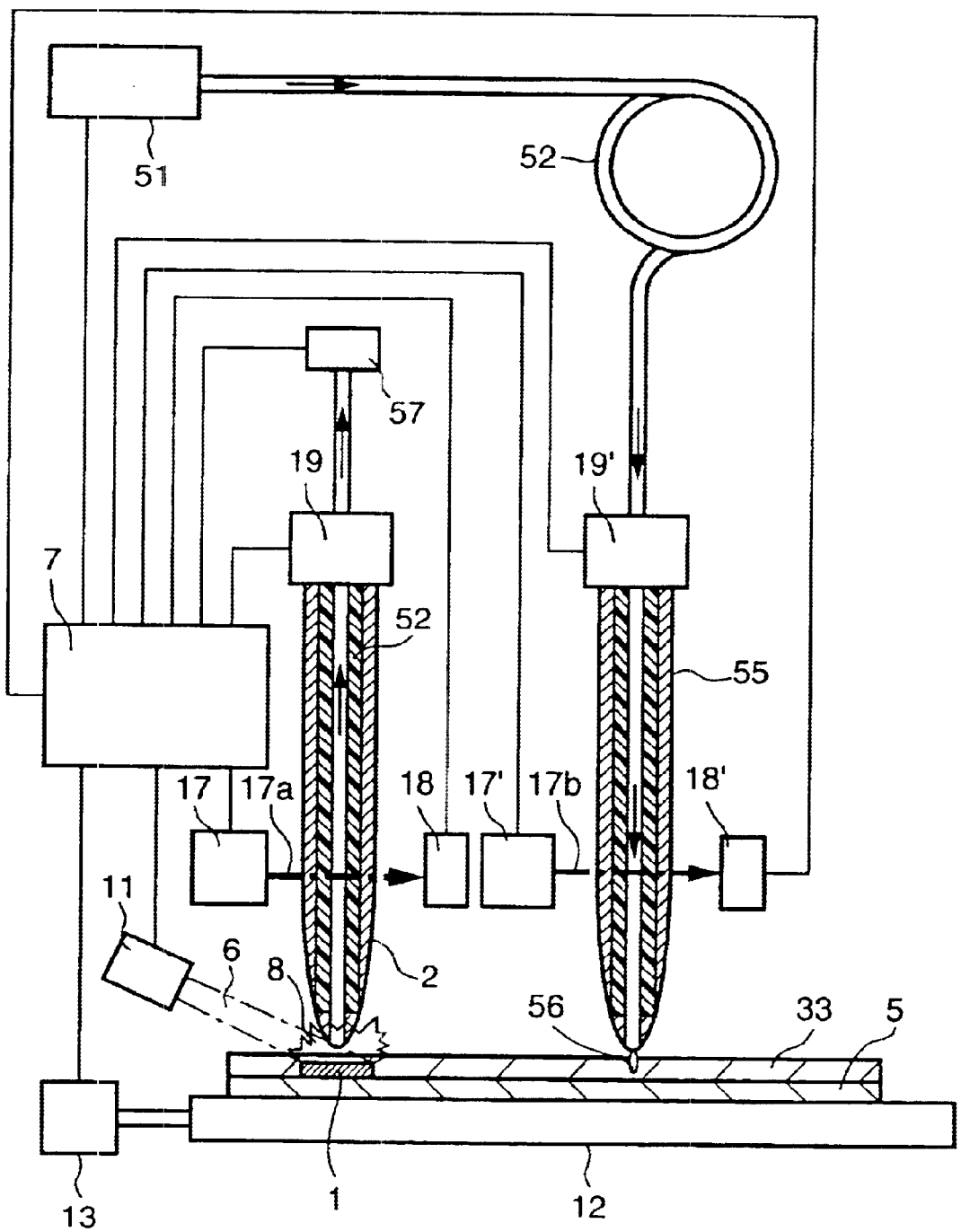
FIG. 17 is a schematic view showing a principal part of the ninth embodiment of the present invention.

FIG. 16 is a schematic view showing a principal part of the principle of exposure using near-field light according to the ninth embodiment of the present invention, and FIG. 17 is a schematic view showing a principal part of the overall arrangement of the ninth embodiment of the present invention.

In the ninth embodiment, non-propagating light which is called near-field light and spreads on the wavelength order is used in exposure and alignment. In the ninth embodiment, a near field is formed on a desired region on an object upon exposure and alignment.

The field of polarization produced in an object by the irradiated light is a nonuniform, nonradiative local electromagnetic field formed by the substance structure, and is called a near field. Near-field light is an expression of local interaction between the two poles in terms of light.

When light is irradiated onto an aperture smaller than its wavelength, near-field light is present in the vicinity of that small aperture in a region which has nearly the same size as the aperture and is separated therefrom by the distance on the wavelength order.

In the ninth embodiment, upon exposure, near-field light which leaks from the distal end of an exposure light irradiation probe with a small aperture on the nanometer order is brought close a photosensitive medium on the object to be exposed on the nanometer order, thus exposing the medium.

Upon alignment, an alignment probe is brought close to the near field to produce scattered light, and the optical information distribution of the object is obtained based on the scattered light to obtain an alignment signal with a resolution on the molecular order, thus attaining alignment.

As described above, the ninth embodiment uses near-field light in exposure and alignment (position detection), and a micropattern is formed by exposure on the object to be exposed.

The resolution of a fine alignment system using near-field light is determined by the size of a small object (probe) to be brought close independently of the wavelength of light, and an object much smaller than the wavelength can be resolved.

The ninth embodiment detects the position information of an object with subnanometer precision using the fine alignment system and a pre-alignment system that feeds the object within the position detectable range of the fine alignment system, and the object is aligned with high precision by a position detection device having these alignment systems. Note that the detection precision of this alignment system is the same as that of the position detection device of the first embodiment mentioned above shown in FIG. 1.

Exposure light is irradiated onto the object to be exposed (wafer) that has been aligned by these alignment systems, thus forming a pattern.

The principle of exposure of an exposure apparatus using near-field light shown in FIG. 16 will be explained below. In FIG. 16, exposure light (e.g., 248 nm) emitted by an exposure light source (e.g. a KrF excimer laser) 51 is guided by a fiber 52 to an exposure light irradiation probe 55 obtained by etching the distal end of the fiber. Near-field light 56 that leaks from a small aperture at the distal end of the probe 55 exposes a resist 33. By controlling the intensity of the near-field light 56 by a controller (control means) while moving the probe 55 and a wafer 5 relative to each other, a desired pattern is formed on the wafer 5. In this case, a piezoelectric element 19 serving as a microscopic drive means is attached to a support portion of the probe 55. The position of the probe 55 is controlled by a shear force detection system (17, 18). In shear force detection, the probe 55 is microscopically vibrated using the piezoelectric element 19, detection light 17a coming from a shear force control light source 17 is irradiated onto the probe 55, and the light components that have passed through the two ends of the probe 55 are detected by a position detector 18, thus detecting any deviation of the resonance frequency.

The ninth embodiment utilizes the fact that when the probe 55 approaches the wafer 5, the probe vibrations are suppressed by the atomic force and the resonance frequency changes.

In the ninth embodiment, when the aligned object to be exposed is exposed by the method shown in FIG. 16, a micropattern on the nanometer order is formed.

An exposure apparatus shown in FIG. 17 will be explained below. In FIG. 17, reference numeral 2 denotes an alignment probe; and 55, an exposure light irradiation probe. The ninth embodiment uses independent probes in exposure and alignment.

The position detection (alignment) method for the object 5 to be exposed (wafer) and the exposure method for forming a pattern by irradiating exposure light are the same as those shown in FIGS. 1 and 16.

A wafer (object to be exposed) 5 applied with a resist 33 is placed on a wafer stage 12 which is movable by a stage drive system 13, and is aligned. The alignment system uses the principle of position detection using near-field light described earlier with reference to FIG. 1 of the first embodiment. More specifically, a near-field optical image formed on a near field 8 of an alignment mark 1 formed on the wafer 5 is detected by a near-field optical system made up of a light irradiation means 11. probe 2, and detector 4. Light emitted by the light irradiation means 11 is diffracted/scattered or absorbed by the alignment mark 1. The probe 2 interacts with the near field 8 to form a new near field. Scattered light 9 present in the changed near field is guided into the fiber 52 by the probe 2 which is formed with a small aperture by etching the distal end of the fiber to sharpen it, forming a gold layer on the circumferential surface of the fiber, and peeling the gold layer from a region having a width of about 10 nm of that distal end portion. The probe 2 can two-dimensionally scan the evaluation position by a piezoelectric element 19, thus capturing the image of the alignment mark 1 as a near-field optical image.

In this case, the position of the probe 2 is controlled by the shear force detection system (17, 18). In shear force detection, the probe 2 is microscopically vibrated using the piezoelectric element 19, detection light 17a is irradiated onto the probe 2, and light components that have passed through the two ends of the probe 2 are detected by the position detector 18, thus detecting any deviation of the resonance frequency. This system utilizes the fact that when the probe 2 approaches the wafer 5, the probe vibrations are suppressed by the atomic force and the resonance frequency changes.

The ninth embodiment uses irradiation light (alignment light) 6 having a wavelength of 1,550 nm. The thickness of the resist 33 is about 0.5 µm, and light having a wavelength longer than the resist thickness is used as alignment light, so that the near-field region from the alignment mark 1 below the resist 33 can spread to the vicinity of the resist surface. Note that light coming from an LD (laser diode) having a wavelength of, e.g., 630 nm, is used as the detection light 17a for shear force control, and the alignment system uses a filter (not shown) that transmits only the wavelength of alignment light, thereby achieving a noise reduction for an alignment signal. The resolution of the alignment system is about 10 nm depending on the size of the aperture, and the. position precision obtained thereby is 1 nm.

The alignment mark 1 used in this system is the same as that shown in FIGS. 10A and 10B of the second embodiment. However, alignment marks with pre-alignment portions are formed at only two positions on the wafer, and other alignment marks consist of dot patterns alone.

In this fashion, the positions of the probe 2 and alignment mark 1 are detected on the nanometer order, and the wafer stage 12 is driven to a desired position using the stage drive system 13 on the basis of the detection signals, thereby controlling the position of the wafer 5. By irradiating near-field light onto the wafer 5 by the exposure method shown in FIG. 16, a desired pattern (micropattern) is formed on the surface of the wafer 5.

More specifically, exposure light emitted by the exposure light source 51 is guided by the fiber 52 to the exposure light irradiation probe 55, and the near-field light 56 that leaks from the small aperture at the distal end of the probe 55 exposes the resist 33. By controlling the intensity of the near-field light 56 while moving the probe 55 and the wafer 5 relative to each other, a desired pattern is formed on the wafer 5.

The exposure region per shot is 10 µm×10 µm. In this case, the probe 55 is driven microscopically by a piezoelectric element 19' attached to the support portion of the probe 55, and the position of the probe 55 is controlled by a shear force detection system (17', 19'). In shear force detection, the probe 55 is microscopically vibrated using the piezoelectric element 19', detection light 17a coming from a light source 17' is irradiated onto the probe 55, and the light components that have passed through the two ends of the probe 55 are detected by a position detector 18', thus detecting any deviation of the resonance frequency. This system utilizes the fact that when the probe 55 approaches the wafer 5, the probe vibrations are suppressed by the atomic force and the resonance frequency changes.

The exposure light irradiation probe 55 has the same arrangement as that of the alignment probe 2. More specifically, the probe 55 is formed with a small aperture by etching the distal end of the fiber to sharpen it, forming a gold layer on the circumferential surface of the fiber, and peeling the gold layer from a region having a width of approximately 10 nm of that distal end portion. A KrF excimer laser is used as an exposure light source, and its wavelength is 248 nm. The minimum line width obtained by exposure is approximately as large as the size of the aperture, i.e., 10 nm.

Upon completion of alignment using a predetermined alignment mark and exposure, the stage 12 is driven by the stage drive system 13. Then, alignment is made using the next alignment mark, and exposure is made. In this manner, the entire wafer is exposed while sequentially repeating the exposure process.

Figure 18:
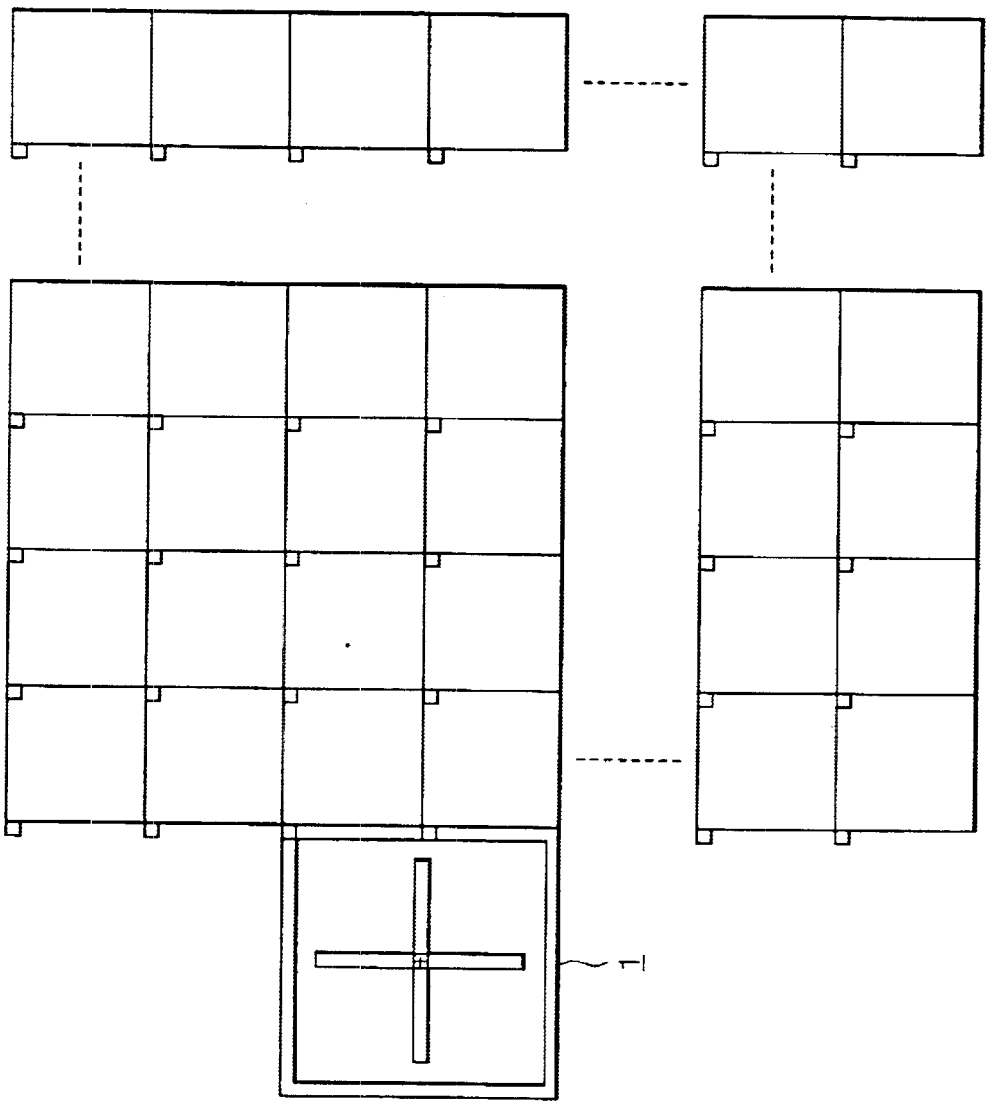
FIG. 18 is an explanatory view of an exposure region and alignment mark shown in FIG. 16.

FIG. 18 shows the layout of exposure regions and the alignment mark. In FIG. 18, a large cross mark 1 in the square at the left end is that for the pre-alignment system and fine alignment system. Also, each full square indicates the formation region of a dot-shaped near-field alignment mark for the fine alignment system. The square regions in the matrix indicate exposure regions per shot.

Figure 19:
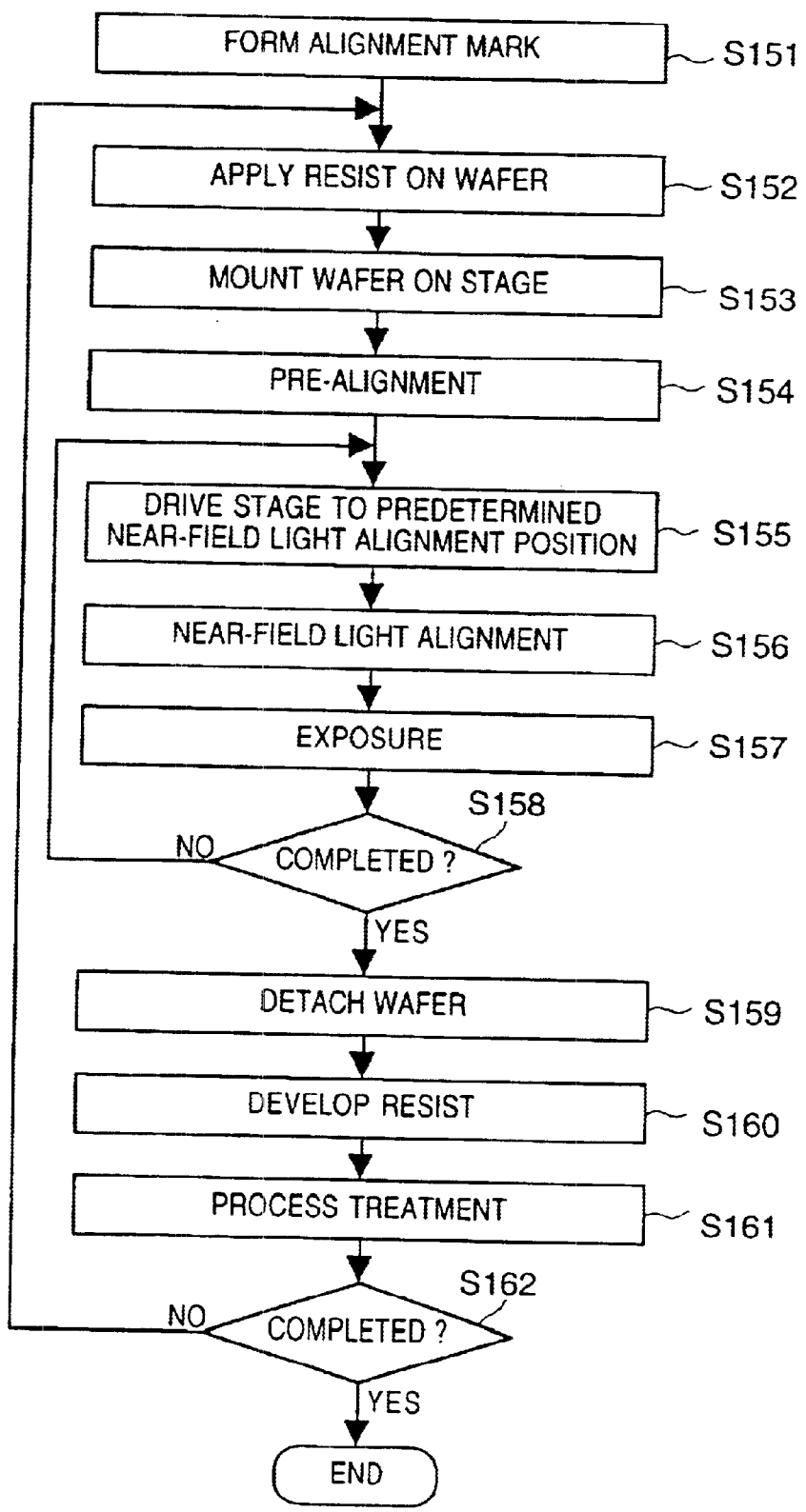
FIG. 19 is an explanatory view of the exposure sequence of the ninth embodiment of the present invention.

FIG. 19 shows the exposure sequence of the ninth embodiment. Note that the aperture used in this embodiment has a diameter of about 10 nm, and the minimum line width is 10 nm. By decreasing the aperture, a minimum line width on the order of 1 nm can be formed by exposure.

In FIG. 19, an alignment mark is formed at a predetermined position on the wafer (step S151). A resist is applied onto the wafer (step S152), and the wafer is mounted on the stage (step S153). At the pre-alignment position, pre-alignment is made (step S154). In order to detect the position by the alignment system using near-field light, the stage is driven to a predetermined near-field light alignment position (step S155), and alignment using the near-field light is done at that alignment position (step S156). Exposure light is then irradiated onto the wafer to form a. desired pattern (step S157). It is then checked if the next exposure region remains (step S158). If the next exposure region remains (No in step S158), the flow returns to step S155. On the other hand, if no next exposure region remains (YES in step S158), the flow advances to step S159.

Upon completion of pattern formation, the wafer is detached (step S159). The exposed wafer is developed to form the pattern (step S160). The developed wafer undergoes a process treatment including etching, ion implantation, film formation, and the like (step S161). After the process treatment, it is checked if the next desired pattern is to be formed (step S162). If the next desired pattern is to be formed (YES in step S162), the flow returns to step S152. On the other hand, if no next desired pattern to be formed is present (NO in step S162), the processing ends.

10th Embodiment

Figure 20:
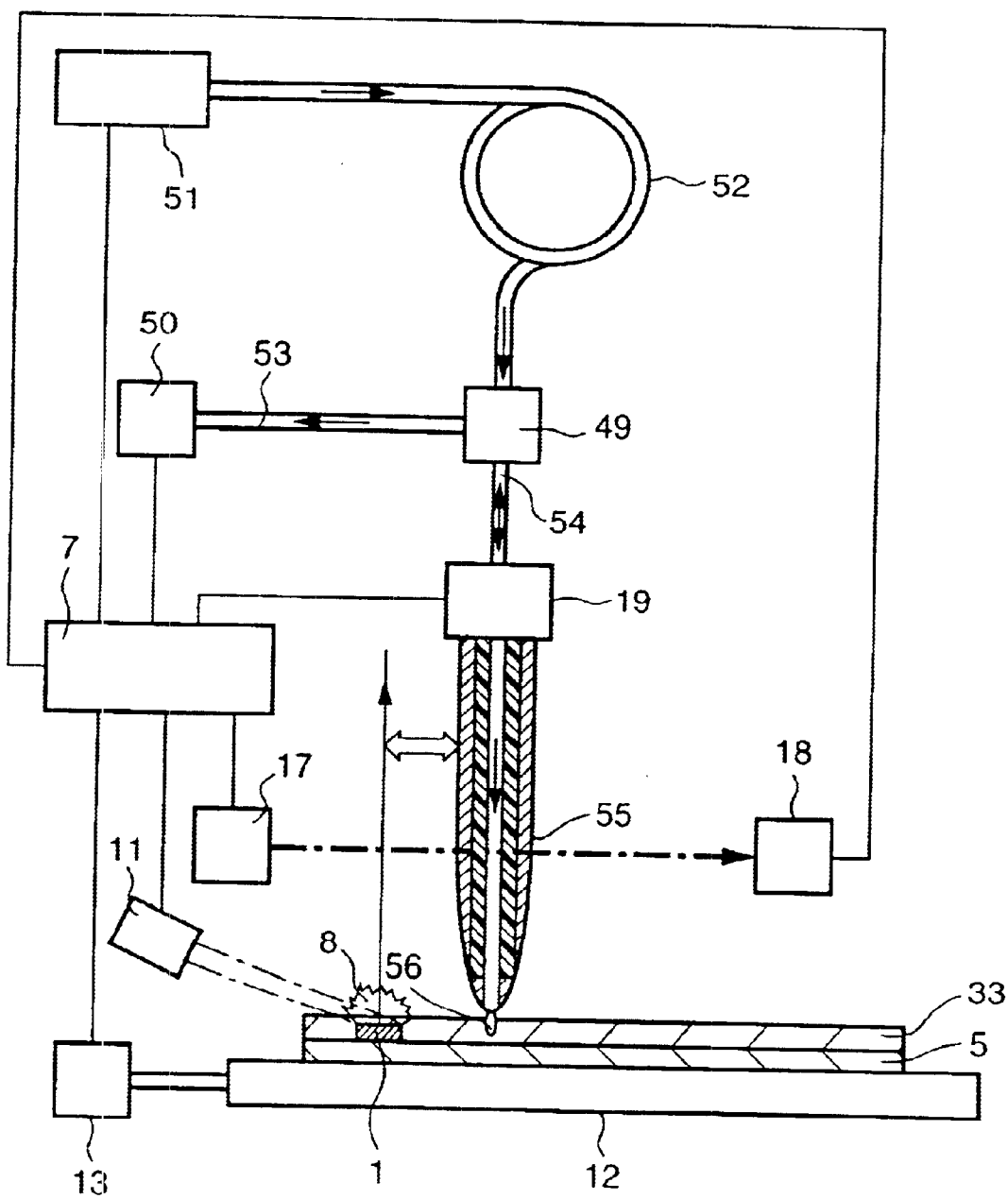
FIG. 20 is a schematic view showing a principal part of the 10th embodiment of the present invention.

FIG. 20 is a schematic view showing a principal part of the 10th embodiment of the present invention. The arrangement of the 10th embodiment is substantially the same as that of the ninth embodiment shown in FIG. 17, except that a common probe 55 is used as the exposure light illumination probe and alignment probe.

A wafer 5 applied with a resist 33 is placed on a wafer stage 12 to perform alignment. In order to detect an alignment mark 1, the probe 55 is driven to and set at a position in the vicinity of the alignment mark 1 by a piezoelectric element 19 (probe drive system), and a near-field optical image of the alignment mark 1 formed on the wafer 5 is detected by a near-field optical system made up of a light irradiation means 11, the probe 55, and a detector 4.

Upon completion of alignment using the predetermined alignment mark 1, exposure is done using near-field light 56. The probe 55 is moved to a predetermined exposure position by the piezoelectric element 19 (probe drive system) on the basis of the alignment result to perform exposure.

The wavelength of the alignment light is 1,550 nm, and that of the exposure light is 248 nm. A fiber for the probe 55 is connected to a fiber 54. Alignment measurement light is guided to an alignment detector 50 via an optical path selection means 49. On the other hand, exposure light originating from an exposure light source 51 is guided to the fiber 54 via a fiber 52 and the optical path selection means 49. The optical path selection means 49 comprises a dichroic mirror that uses wavelength differences.

In the 10th embodiment, when light coming from the irradiation means 11 used in alignment is also irradiated, onto an exposure region, a latent image formed on the resist by exposure can also be monitored via the alignment system.

11th Embodiment

Figure 21:
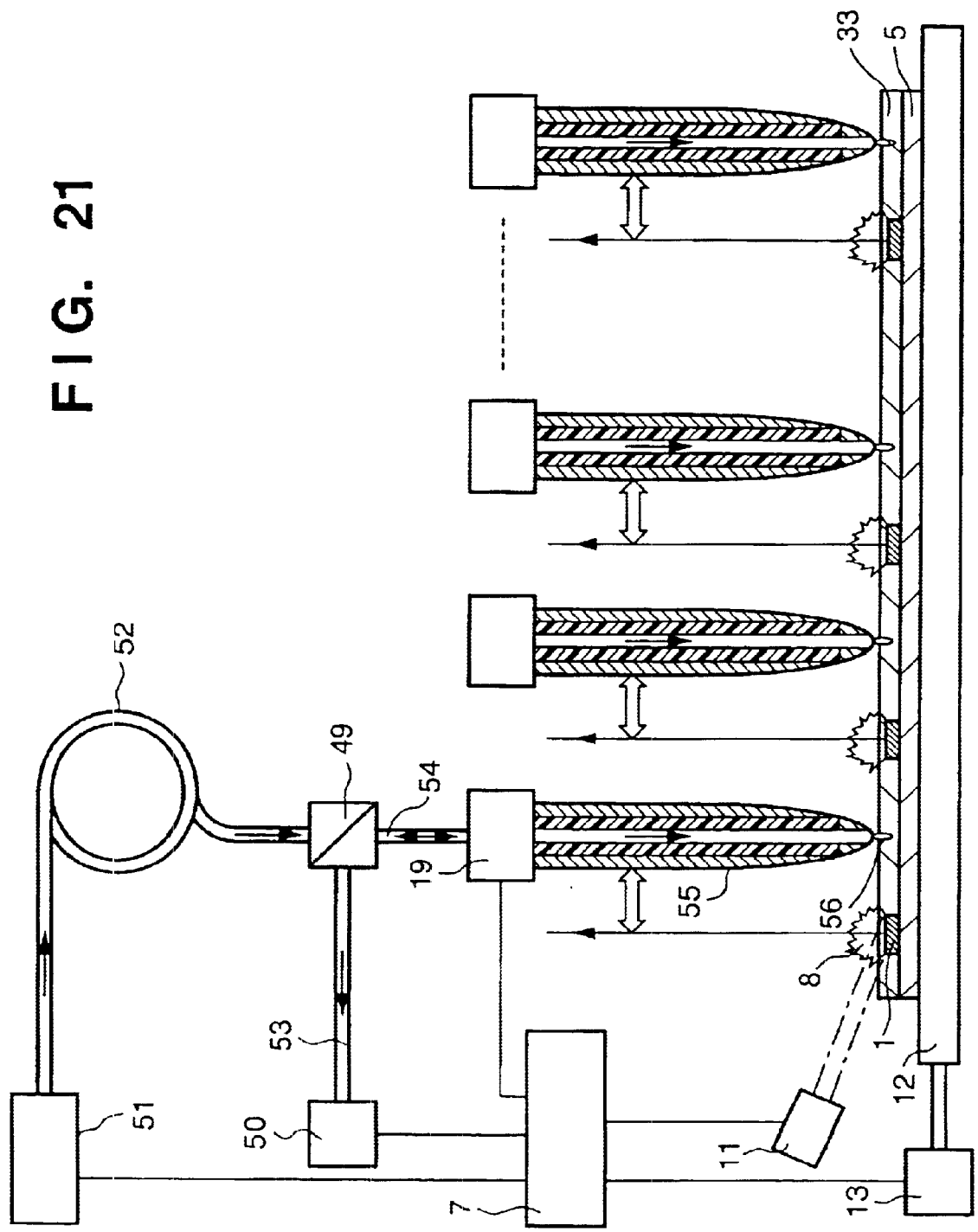
FIG. 21 is a schematic view showing a principal part of the 11th embodiment of the present invention.

FIG. 21 is a schematic view showing a principal part of the 11th embodiment of the present invention. The arrangement of the 11th embodiment is substantially the same as that of the 10th embodiment shown in FIG. 20, except that 40×40 sets of the respective components of the exposure and alignment systems including the probe 55 used in the 10th embodiment are disposed in a matrix, and the respective regions are individually subjected to alignment and exposure to improve the throughput.

In the 11th embodiment, 500×500 exposure regions per shot are processed by a single probe, and a region corresponding to a 200-mm$^2$ square on the wafer is exposed in a single process.

A wafer 5 applied with a resist 33 is placed-on a wafer stage 12 to perform alignment. In order to detect an alignment mark 1, the probe 55 is driven to and set at a position in the vicinity of the alignment mark 1 by a piezoelectric element 19 (probe drive system), and a near-field optical image of the alignment mark 1 formed on the wafer 5 is detected by a near-field optical system made up of a light irradiation means 11, the probe 55, and a detector 4.

Upon completion of alignment using the predetermined alignment mark 1, exposure is done using near-field light. The probe 55 is moved to a predetermined exposure position by the piezoelectric element 19 (probe drive system) on the basis of the alignment result to perform exposure. Such processes are parallelly executed in units of probes.

The wavelength of the alignment light is 1,550 nm, and that of the exposure light is 248 nm. A fiber for the probe 55 is connected to a fiber 54. Alignment measurement light is guided to an alignment detector 50 via an optical path selection means 49. On the other hand, exposure light originating from an exposure light source 51 is guided to the fiber 54 via a fiber 52 and the optical path selection means 49. The optical path selection means 49 comprises a dichroic mirror that uses wavelength differences.

When light coming from the irradiation means used in alignment is also irradiated onto an exposure region, a latent image formed on the resist by exposure can also be monitored via the alignment system.

The 11th embodiment uses an Si wafer, but may use a transparent substrate. In this case, alignment light may be irradiated from not only a position above the wafer but also a position underneath the transparent substrate. Furthermore, the alignment light may be irradiated from the side surface of the transparent substrate.

12th Embodiment

Figure 22:
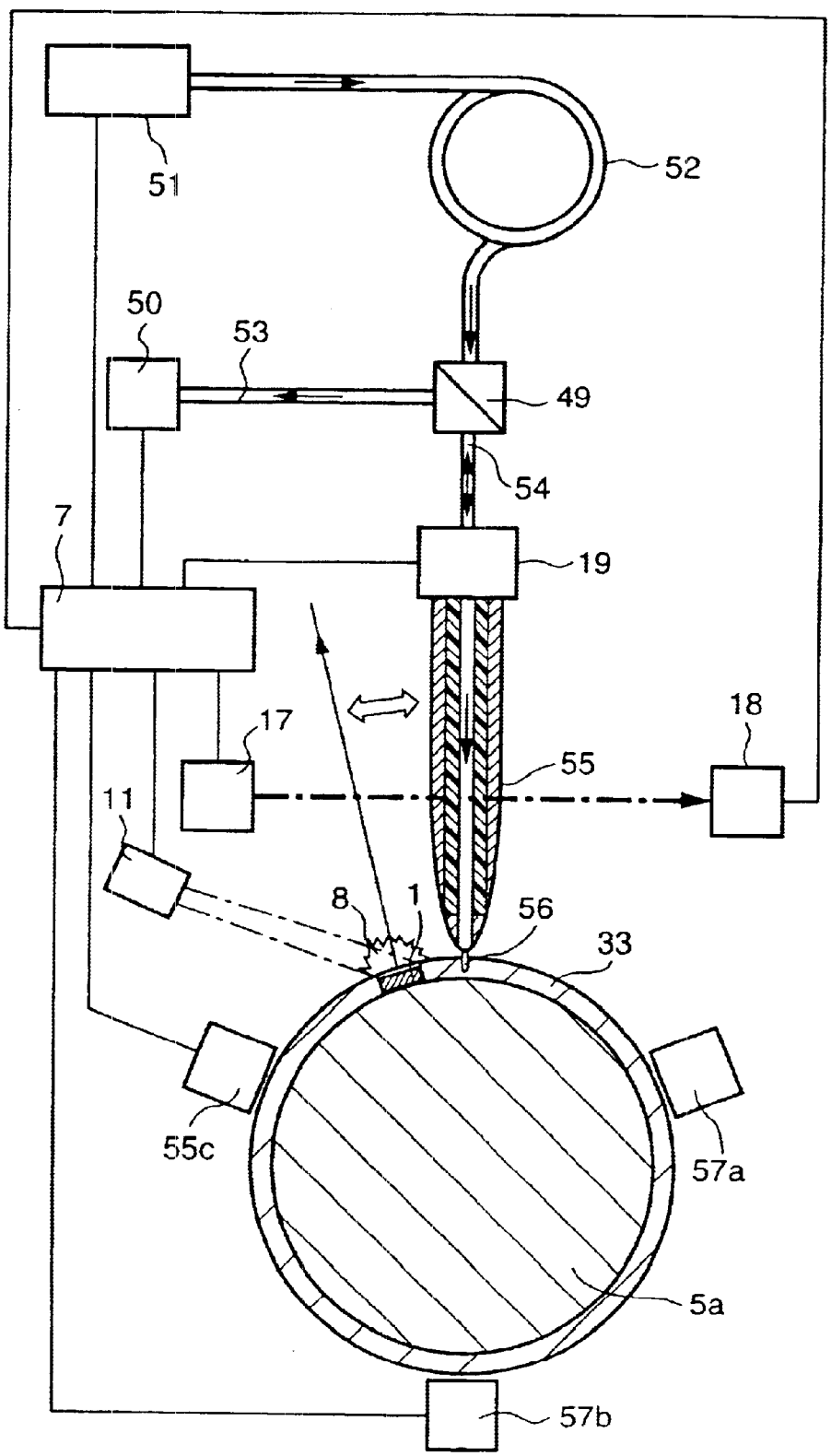
FIG. 22 is a schematic view showing a principal part of the 12th embodiment of the present invention.

FIG. 22 is a schematic view showing a principal part of the 12th embodiment of the present invention. The arrangement of the 12th embodiment is substantially the same as that of the 10th embodiment shown in FIG. 20, except that a spherical Si ball wafer (substrate) 5a is used as the object to be exposed.

A resist 33 is applied onto the spherical Si ball wafer (substrate) 5a, and high-frequency vibrations are applied to the wafer 5a by piezoelectric elements 57 (57a to 57c) disposed around the wafer 5a to rotate and move the wafer 5a, thus attaining position control of the wafer 5a.

Alignment is performed using an alignment mark 1 formed on the wafer 5a. At this time, in this alignment detection, the same alignment system as that used in the 10th embodiment is used. In the 12th embodiment, the alignment system operates similarly since only the flat wafer surface is replaced by a spherical surface. That is, translation by the stage is replaced by rotation using the piezoelectric elements 57 disposed around the wafer.

Upon completion of alignment using the predetermined alignment mark 1, exposure is made using near-field light. As in the 10th embodiment, a probe 55 also serves as that of an exposure system. Hence, the probe 55 is moved to a predetermined exposure position by a piezoelectric element 19 (probe drive system) on the basis of the alignment result to perform exposure.

Note that relative movement between the probe and the spherical wafer 5a may be attained by the piezoelectric elements 57 placed around the wafer.

Also, a plurality of probes may be arranged around the ball as in the 11th embodiment to improve the throughput.

The wavelength of the alignment light is 1,550 nm, and that of the exposure light is 248 nm. A fiber for the probe 55 is connected to a fiber 54. Alignment measurement light is guided to an alignment detector 50 via an optical path selection means 49. On the other hand, exposure light originating from an exposure light source 51 is guided to the fiber 54 via a fiber 52 and the optical path selection means 49. The optical path selection means 49 comprises a dichroic mirror that uses wavelength differences.

The 12th embodiment uses an Si wafer but may use a transparent substrate.

In the ninth to 12th embodiments, the wafer used mainly consists of Si. Alternatively, a wafer consisting of GaAs as a major component or a glass transparent substrate may be used, and exposure can be done irrespective of the materials of the wafers. The exposure apparatus can manufacture a BO (Binary Optics) device (microstructural device). In the case of a wafer consisting of a transparent substrate, alignment pumping light can be irradiated onto the alignment mark from the interior of the transparent substrate in a total reflection state.

As described above, according to the ninth to 12th embodiments, an exposure apparatus which can easily form a subnanometer micropattern using near-field light that leaks from the distal end of the exposure light irradiation probe with a small aperture on the nanometer order upon exposure, and is suitable for a micro-working tool for manufacturing devices such as semiconductor elements, and a device manufacturing method using the same can be achieved.

Also, an image which has a resolution as low as the wavelength order upon detecting an alignment mark by a conventional system can be obtained to have a resolution as high as 1/100 or less the wavelength, i.e., the nanometer order, by exploiting a near-field optical system. Furthermore, subnanometer position detection can be realized. When the alignment system is used in the exposure apparatus, micro-working on the nanometer order can be realized.

Moreover, since the alignment system and exposure apparatus are combined, micro-working for an exposure region over a broader range can be realized. Such an exposure apparatus can expose, e.g., a spherical surface irrespective of the shapes of substrates. Since micro-working on the nanometer order is attained, a device that provides its function with a structure on the nanometer order can be manufactured.

13th Embodiment

Figure 23:
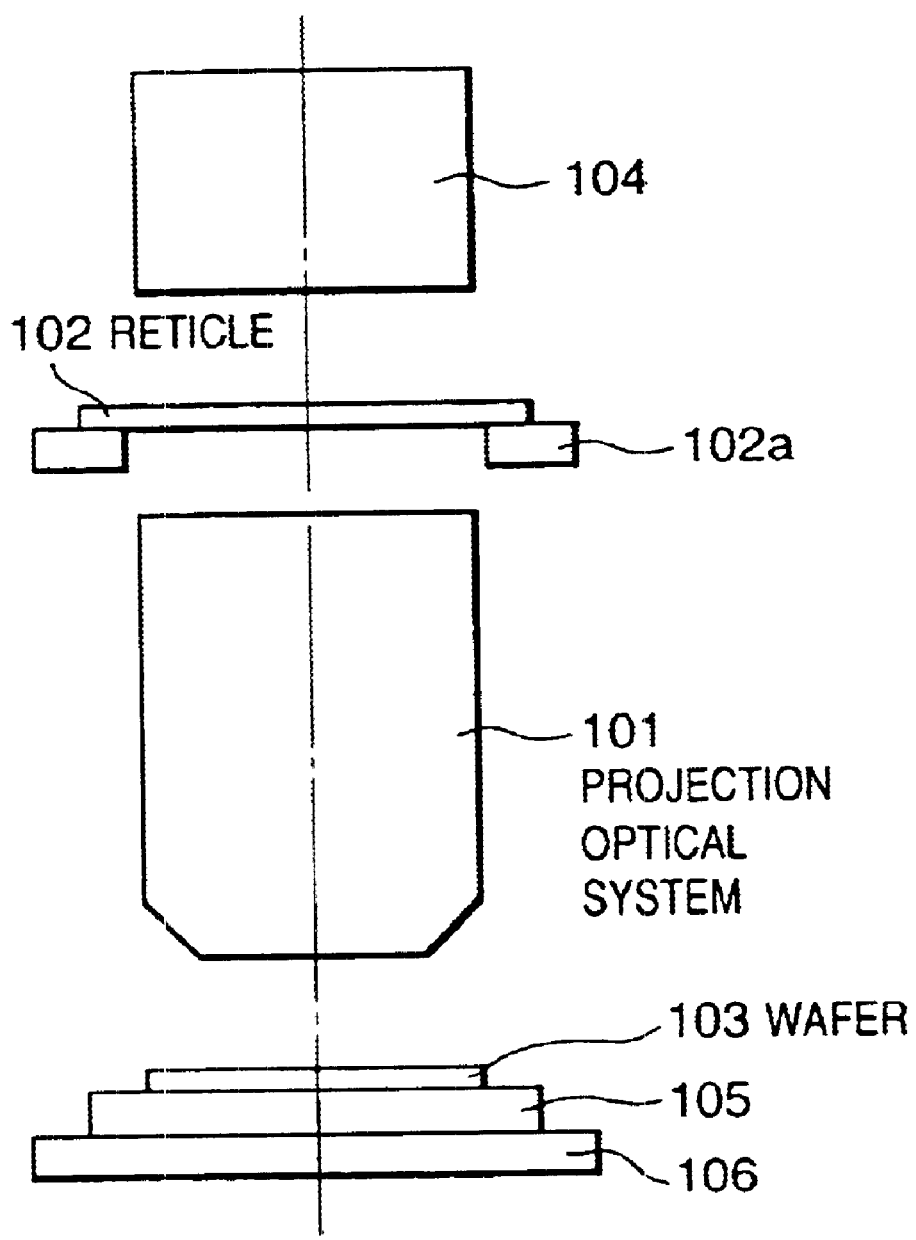
FIG. 23 is a schematic view showing a principal part of a projection exposure apparatus according to the present invention.

FIG. 23 is a schematic view of a stepper as a pattern exposure means used in the 13th embodiment of the present invention.

In the 13th embodiment, when a coarse pattern portion of a micropattern is to be transferred by exposure onto a photosensitive substrate (wafer), a stepper (excimer stepper) as a pattern exposure means with a conventional arrangement shown in FIG. 23 is used.

Upon completion of transfer of the coarse pattern by exposure, the photosensitive substrate is subjected to development. Upon completion of patterning of the coarse pattern, a fine pattern is exposed by a near-field light exposure means using near-field light shown in FIG. 16 or 17 in the above-mentioned ninth embodiment.

The pattern exposure means (projection exposure apparatus) for transferring a coarse pattern onto a photosensitive substrate by exposure in the 13th embodiment shown in FIG. 23 will be explained below. The pattern exposure means has the same arrangement as that of a known stepper.

The projection exposure apparatus of the 13th embodiment can be applied to both the step-and-repeat and step-and-scan methods. In FIG. 23, reference numeral 102 denotes a reticle, on the surface of which an electronic circuit pattern is formed. Reference numeral 102a denotes a reticle stage, which holds the reticle 102. Reference numeral 104 denotes an illumination system, which focuses an exposure light beam emitted by a light source means having, e.g., an excimer laser, ultra-high-pressure mercury lamp, or the like and illuminates the electronic circuit pattern on the surface of the reticle 102 with a uniform illuminance distribution.

Reference numeral 101 denotes a projection optical system (projection lens) which projects the electronic circuit pattern on the surface of the reticle 102 illuminated with the exposure light coming from the illumination system 104 onto the surface of a wafer (photosensitive substrate) 103 as a substrate to be exposed at a predetermined magnification (e.g., 1/5 or 1/10).

The surface of the wafer 103 is applied with a photosensitive material such as a resist. Reference numeral 105 denotes a wafer chuck, which chucks the wafer 103. Reference numeral 106 denotes a wafer stage, which drives the wafer chuck 105 within a predetermined plane (X-Y plane).

In the 13th embodiment, the above-mentioned pattern exposure means transfers a coarse pattern onto the substrate surface by exposure. In this case, the pattern on the reticle is formed so that the exposure portion of the fine pattern is not exposed when a positive resist is used, and the entire surface is exposed when a negative resist is used.

In the 13th embodiment, transfer by exposure and alignment of a fine pattern (micropattern) using near-field light are the same as that described above with the aid of FIGS. 16 and 17 in the ninth embodiment mentioned above, and a detailed description thereof will be omitted.

Figure 24:
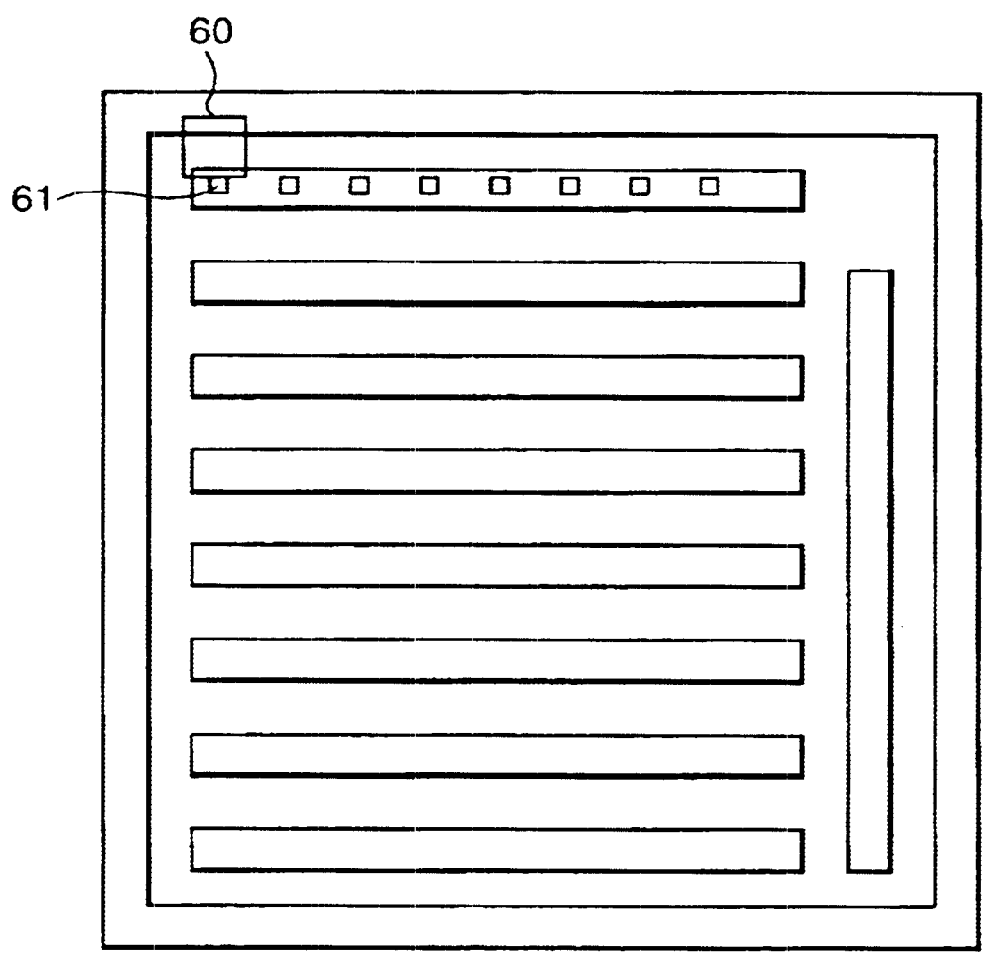
FIG. 24 is an explanatory view of an alignment mark.

FIG. 24 is an explanatory view when a portion of a coarse pattern is used as an alignment pattern. In FIG. 24, reference numeral 60 denotes a region to be subjected to image processing; and 61, a fine pattern.

In the 13th embodiment, image data obtained by a near-field optical system (FIG. 24) is analyzed by a controller 7 to obtain the position information of an alignment pattern 1, thereby detecting the position of a wafer 5.

A wafer stage 12 that carries the wafer 5 is driven by a stage drive system 13 on the basis of position deviation information obtained by the controller 7, thus performing position control.

In this way, upon completion of alignment using a portion of the coarse pattern at a predetermined position formed by exposing the coarse pattern as an alignment pattern, exposure is made using the near-field light exposure means shown in FIG. 16 or 17 of the above ninth embodiment to transfer the fine pattern 61 onto the wafer by exposure.

Upon completion of alignment using a predetermined alignment mark and exposure, the stage 12 is driven by the stage drive system 13, and alignment is done using the next portion of the coarse pattern as an alignment mark. After the alignment, exposure is made. In this manner, the entire surface of the wafer is exposed while repeating the exposure process.

The relationship between the exposure region to be exposed after single alignment upon exposing a fine pattern, and the portion of the coarse pattern used as an alignment mark at that time is as shown in FIG. 18 above. In FIG. 18, a large cross mark 1 in the square at the left end is a pre-alignment mark. In FIG. 18, a coarse pattern portion used in alignment is the one located at a predetermined position on a mesh to be exposed after a single alignment process. However, the present invention is not limited to this, and a proper coarse pattern portion in the vicinity of the actual formation position of a fine pattern may be used. Note that the square regions in the matrix indicate exposure regions per shot.

Figure 25:
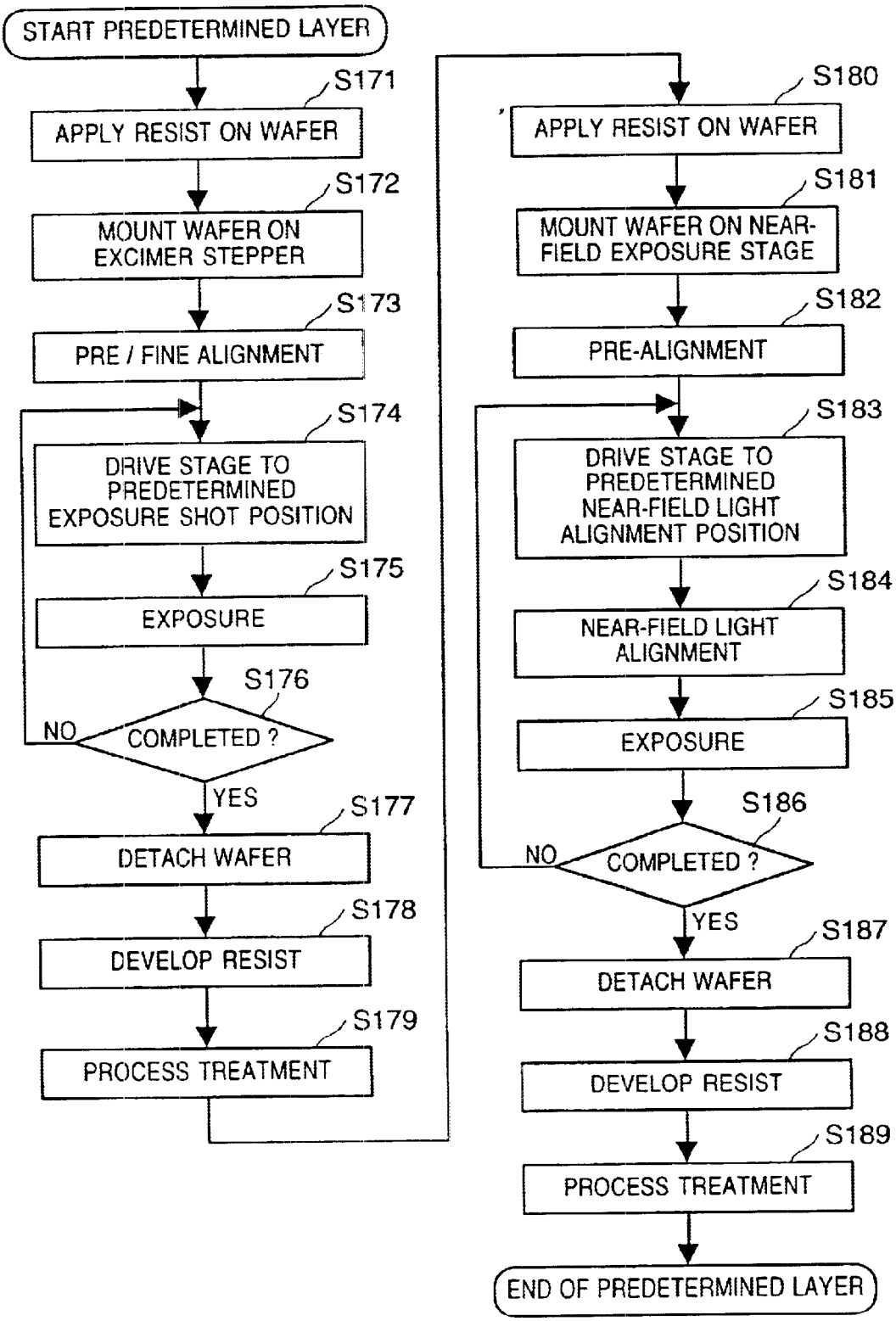
FIG. 25 is an explanatory view of the exposure sequence of the 13th embodiment of the present invention.

FIG. 25 shows the exposure sequence of the 13th embodiment. Note that the aperture used in this embodiment has a diameter of about 10 nm, and the minimum line width is 10 nm. By decreasing the aperture, a minimum line width on the order of 1 nm can be formed by exposure.

In FIG. 25, after an alignment mark is formed at a predetermined position on the wafer, a resist is applied onto the wafer (step S171). The wafer is mounted on the excimer stepper (step S172). Pre/fine alignment is made at a pre/fine alignment position (step S173). The stage is moved to a predetermined exposure shot position (step S174), and exposure is made at that position (step S175). It is then checked if the next exposure region remains (step S176). If the next exposure region remains (NO in step S176), the flow returns to step S174. On the other hand, if no next exposure region remains (YES in step S176), the flow advances to step S177.

Upon completion of pattern formation, the wafer is detached (step S177). The exposed wafer is developed to form the pattern (step S178). The developed wafer undergoes a process treatment including etching, ion implantation, film formation, and the like (step S179).

Upon completion of the process treatment, after an alignment mark is formed at a predetermined position on the wafer again, a resist is applied onto the wafer (step S180) The wafer is mounted on the stage of the exposure apparatus using near-field light (step S181). Pre-alignment is performed at a pre-alignment position (step S182). The stage is driven to a predetermined near-field light alignment position to detect the position of the wafer by the alignment system using near-field light (step S183), and alignment using near-field light is made at that alignment position (step S184). Exposure light is then irradiated onto the wafer to form a desired pattern (step S185), it is checked if the next exposure region remains (step S186). If the next exposure region remains (NO in step S186), the flow returns to step S183. On the other hand, if no next exposure region remains (YES in step S186), the flow advances to step S187.

Upon completion of pattern formation, the wafer is detached (step S187). The exposed wafer is developed to form the pattern (step S188). The developed wafer undergoes a process treatment including etching, ion implantation, film formation, and the like (step S189).

14th Embodiment

The arrangement of the 14th embodiment is substantially the same as that of the 13th embodiment, except that a common probe 55 is used as the exposure light illumination probe and alignment probe. Such an arrangement will be described below with reference to FIG. 20.

A wafer 5 on which a resist 33 has been applied and a coarse pattern has already been formed is placed on a wafer stage 12, and is aligned. In order to detect a portion of the coarse pattern as an alignment mark, the probe 55 is driven to and set at a position in the vicinity of an alignment mark 1 by a piezoelectric element 19 (probe drive system), and a near-field optical image of an alignment mark 1 formed on the wafer 5 is detected by a near-field optical system made up of a light irradiation means 11, the probe 55, and a detector 4.

Upon completion of alignment using a predetermined portion of the coarse pattern, exposure is done using near-field light 56. The probe 55 is moved to a predetermined exposure position by the piezoelectric element 19 (probe drive system) on the basis of the alignment result to perform exposure.

In the 14th embodiment, after a coarse pattern is transferred onto the wafer by exposure, the wafer is developed, and only the coarse pattern undergoes a process. After that, a fine pattern is formed by exposure. However, the coarse and fine patterns may be successively formed.

More specifically, after a coarse pattern is formed by exposure by a projection type excimer stepper using a positive resist, alignment is performed using a portion of the latent image of the coarse pattern as an alignment mark, and a fine pattern is transferred to a predetermined position by exposure using near-field light.

15th Embodiment

Figure 26:
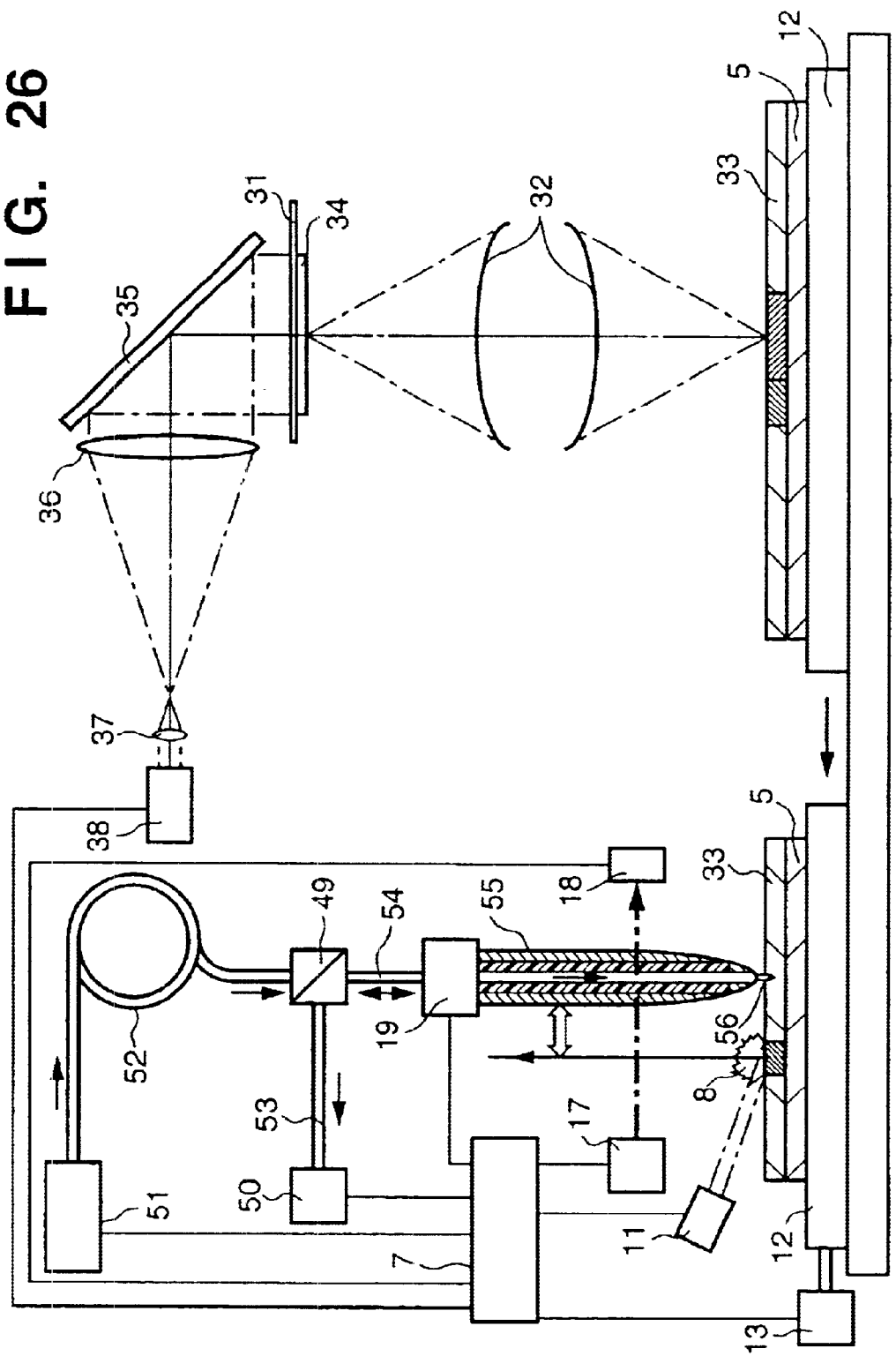
FIG. 26 is a schematic view showing a principal part of the 15th embodiment of the present invention.

FIG. 26 is a schematic view showing a principal part of an integrated exposure apparatus according to the 15th embodiment of the present invention, which can expose both coarse and fine patterns. In FIG. 26, an excimer stepper unit (pattern exposure means) exposes a coarse pattern first. An excimer laser 38 emits a laser beam, which illuminates a reticle 31 via lenses 37 and 36, and mirror 35. A reticle pattern 34 on the reticle 31 illuminated with the laser beam is imaged on a resist 33 on the region to be exposed on the surface of a wafer 5 via a projection lens 32, thus exposing the resist 33.

Figure 27:
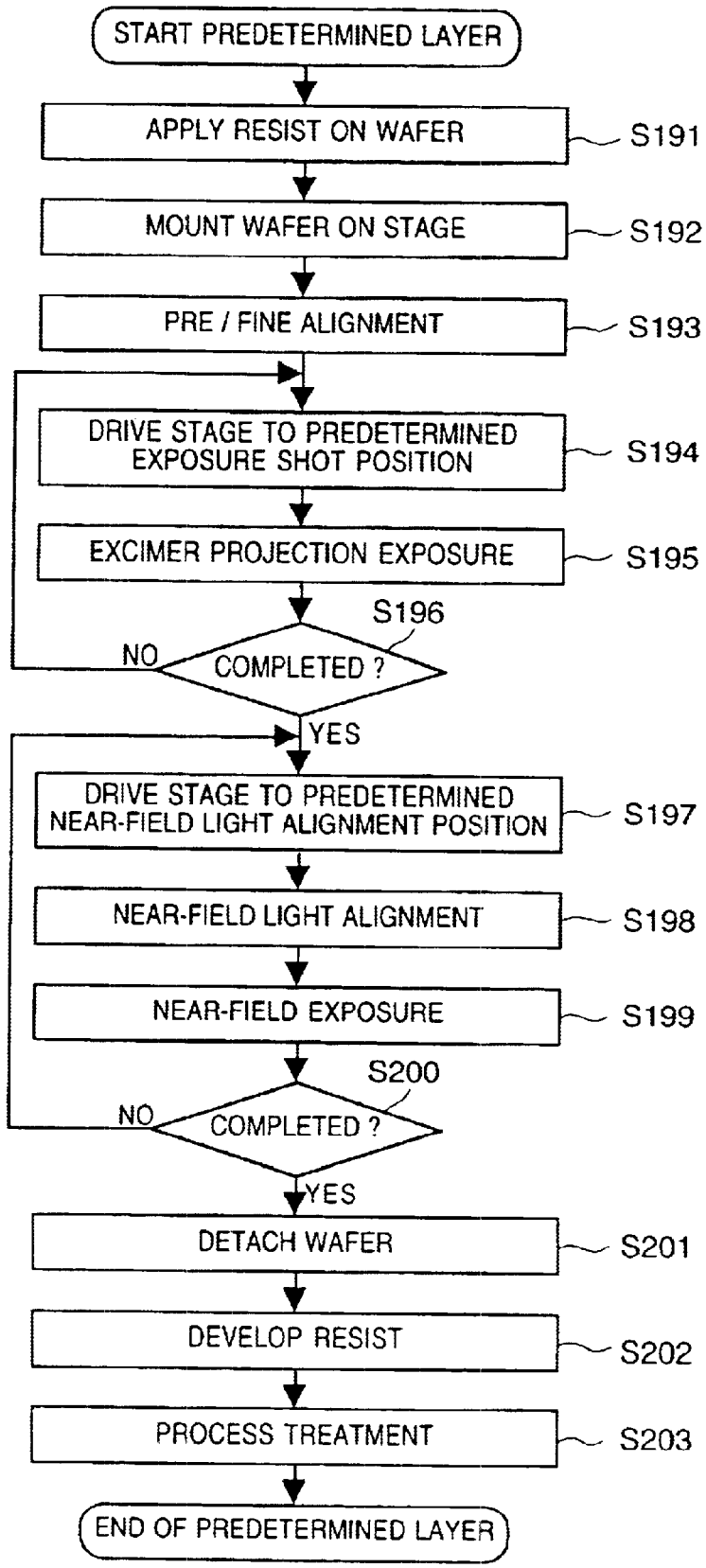
FIG. 27 is an explanatory view of the exposure sequence of the 15th embodiment of the present invention.

A stage 12 is moved to a near-field light exposure means for forming a fine pattern on the wafer 5 by exposure, and near-field light alignment is made using a latent image at a predetermined position of the coarse pattern as an alignment pattern. Upon completion of alignment, a fine pattern is formed on the resist 33 by exposure using near-field light. After both the coarse and fine patterns are formed by exposure, the wafer 5 is detached and developed to manufacture a device. In such an exposure apparatus, both the coarse and fine patterns can be simultaneously developed. FIG. 27 shows the exposure sequence of this embodiment.

In FIG. 27, after an alignment mark is formed at a predetermined position on the wafer, a resist is applied onto the wafer (step S191). The wafer is mounted on the stage (step S192). Pre/fine alignment is made at a pre/fine alignment position (step S193). The stage is moved to a predetermined exposure shot position (step S194), and exposure is made by projecting an excimer laser beam at that position (step S195). It is then checked if the next exposure region remains (step S196). If the next exposure region remains (NO in step S196), the flow returns to step S194. On the other hand, if no next exposure region remains (YES in step S196), the flow advances to step S197.

In order to detect the position of the wafer by the alignment system using near-field-light, the stage is driven to a predetermined near-field light alignment position (step S197), and alignment using near-field light is made at that alignment position (step S198). Exposure light based on near-field light is then irradiated onto the wafer to form a desired pattern (step S199). It is checked if the next exposure region remains (step S200). If the next exposure region remains (NO in step S200), the flow returns to step S197. On the other hand, if no next exposure region remains (YES in step S200), the flow advances to step S201.

Upon completion of pattern formation, the wafer is detached (step S201). The exposed wafer is developed to form the pattern (step S202). The developed wafer undergoes a process treatment including etching, ion implantation, film formation, and the like (step S203).

In the 15th embodiment, the exposure wavelength upon exposing a coarse pattern by the excimer stepper may be the same as that upon exposing a fine pattern using near-field light. With this arrangement, successive exposure can be made using an identical resist.

16th Embodiment

The arrangement of the 16th embodiment is substantially the same as that of the 14th embodiment, except that 40×40 sets of the respective components of the exposure and alignment systems including the probe 55 used in the 14th embodiment are disposed in a matrix, and the respective regions are individually subjected to alignment and exposure to improve the throughput. This arrangement will be described below with reference to FIG. 21.

In the 16th embodiment, 500×500 exposure regions per shot shown in FIG. 18 are processed by a single probe, and a region corresponding to a 200-mm² square on the wafer is exposed in a single process.

A wafer 5 on which a resist 33 has been applied and a coarse pattern has already been formed is placed on a wafer stage 12 to perform alignment. In order to detect a predetermined alignment mark 1 as a portion of the coarse pattern, the probe 55 is driven to and set at a position in the vicinity of the alignment mark 1 by a piezoelectric element 19 (probe drive system), and a near-field optical image of the alignment mark 1 formed on the wafer 5 is detected by a near-field optical system made up of a light irradiation means 11, the probe 55, and a detector 4.

Upon completion of alignment using the alignment mark 1 as the predetermined portion of the coarse pattern, exposure is done using near-field light. The probe 55 is moved to a predetermined exposure position by the piezoelectric element 19 (probe drive system) on the basis of the alignment result to perform exposure. Such processes are executed in parallel in units of probes.

17th Embodiment

Figure 28:
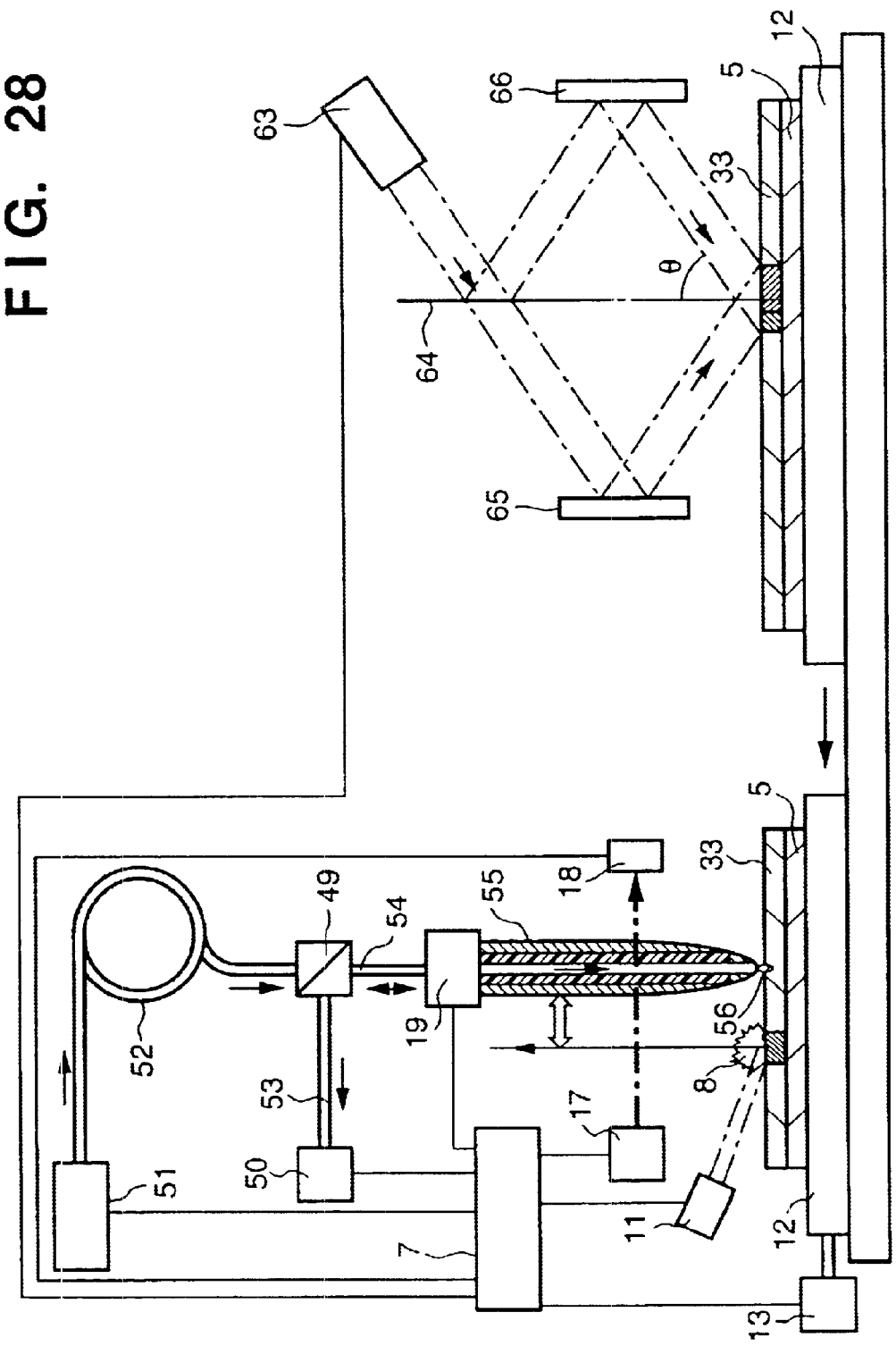
FIG. 28 is a schematic view showing a principal part of the 17th embodiment of the present invention.

FIG. 28 is a schematic view showing a principal part of the 17th embodiment of the present invention. The basic arrangement of the 17th embodiment is substantially the same as that of the 13th embodiment, except that a coarse pattern is transferred by exposure using an interference exposure apparatus in place of the projection exposure apparatus as the pattern exposure means shown in FIG. 23.

The interference exposure system shown in FIG. 28 splits a light beam coming from a light source 63 into two beams by a half mirror 64, and makes the two beams become incident on the corresponding exposure regions on a wafer 5 at an incident angle θ, thereby recording interference fringes of the two light beams on the basis of a grating pattern having an equal pitch p. An intensity distribution I(x) at a position x in a direction perpendicular to the interference fringes of the two light beams is given by:

$$I(x)=1/2+(1/2)\cos\{(4\pi/\lambda)\times\sin\theta)\}$$

where θ is the incident angle of the two light beams, and λ is the wavelength.

The pitch p of the interference fringes is given by λ/(2sinθ). If an excimer laser of λ=248 nm as the exposure wavelength is used, and the incident angle θ is set at 60°, the pitch p is 143 nm, and a minimum L & S is 72 nm.

In order to form a more complicated pattern by exposure, a plurality of light beams may be used or multiple exposure may be made to form a predetermined pattern.

After a relatively simple, coarse pattern is formed by exposure, near-field exposure is made to form a fine pattern or to form an arbitrary circuit pattern by connecting simple patterns. This embodiment adopts the following apparatus arrangement. That is, after the coarse pattern is exposed by interference exposure, the wafer 5 is directly moved to a near-field exposure system without being developed, and is aligned by an alignment system using near-field light on the basis of the latent image of the coarse pattern obtained by the interference exposure previously. After that, a fine pattern is exposed using near-field light.

Figure 29:
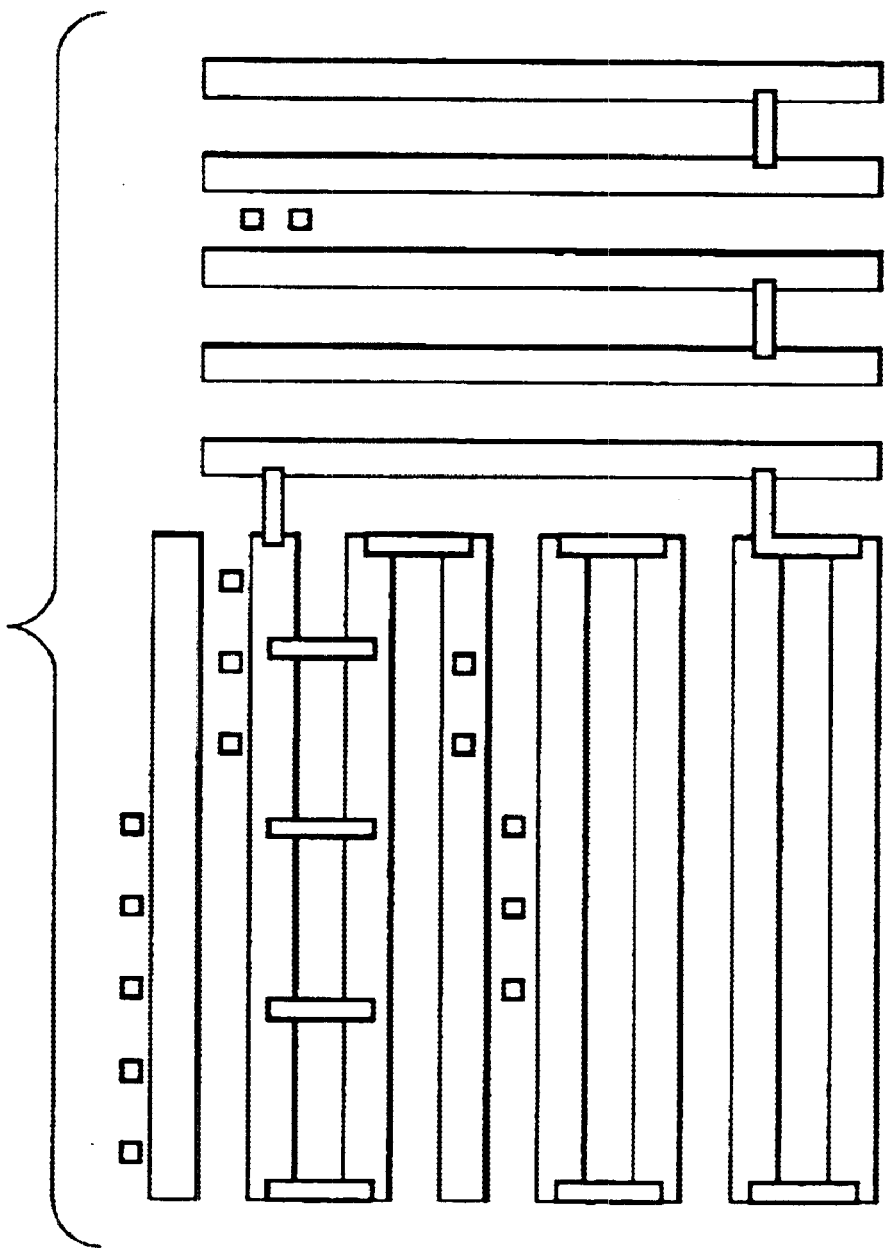
FIG. 29 is an explanatory view of an exposure pattern in the 17th embodiment of the present invention.

FIG. 29 is an explanatory view of an example wherein simple patterns are formed by interference exposure, and are connected by near-field exposure to form a complicated pattern. In FIG. 29, the pattern portions to be formed by near-field exposure apainted in black.

The wavelength of the alignment light is 1,550 nm, and that of the exposure light is 248 nm. A fiber for the probe 55 is connected to a fiber 54. Alignment measurement light is guided to an alignment detector 50 via an optical path selection means 49. On the other hand, exposure light originating from an exposure light source 51 is guided to the fiber 54 via a fiber 52 and the optical path selection means 49. The optical path selection means 49 comprises a dichroic mirror that uses wavelength differences.

As the resist 33, a resist for an excimer laser having a wavelength of 248 nm is used. Since both the interference exposure and near-field exposure use an identical wavelength, the two exposure modes can be executed successively.

In addition, upon forming a fine pattern by near-field exposure, all the detailed arrangement and modified arrangements described in the 13th embodiment above can be used.

Figure 30:
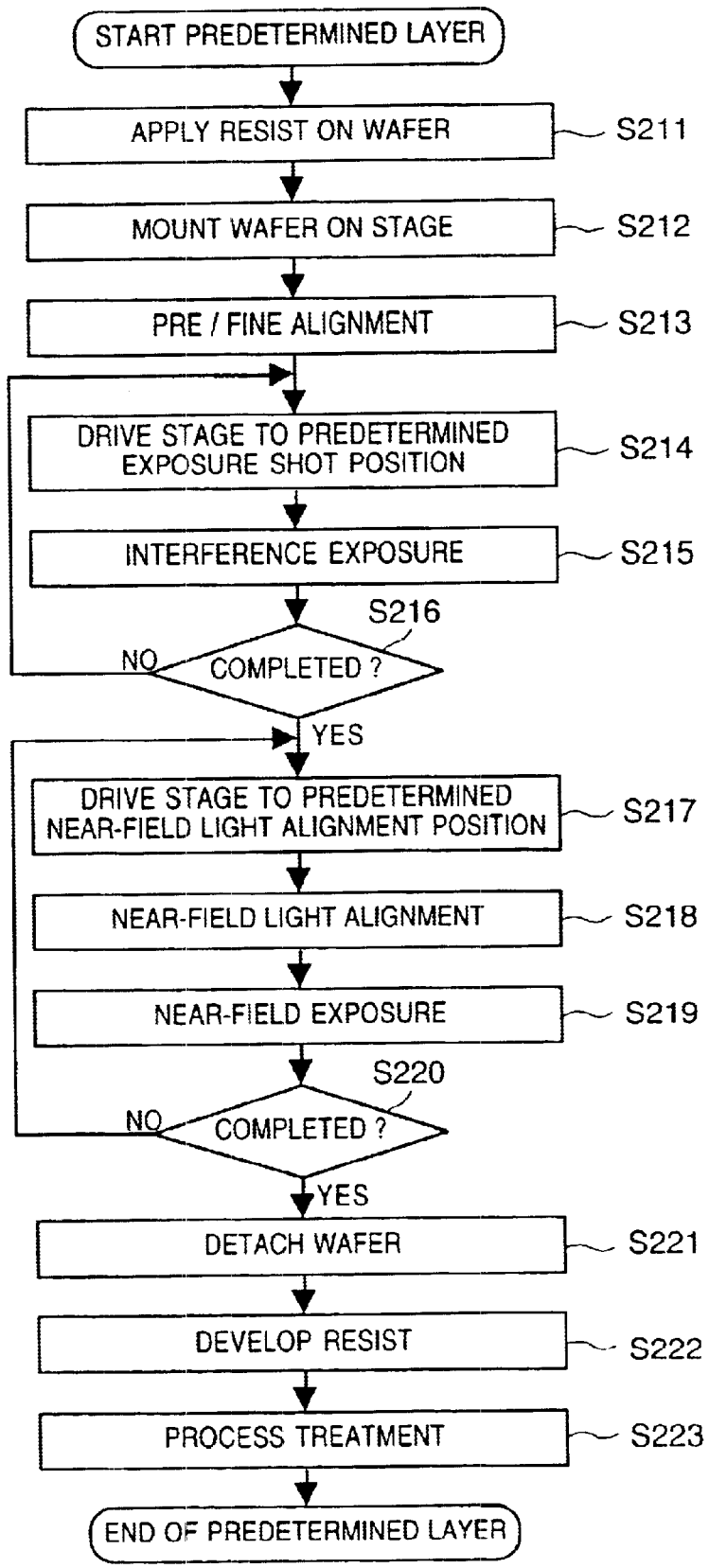
FIG. 30 is an explanatory view of the exposure sequence of the 17th embodiment of the present invention.

FIG. 30 shows the exposure sequence of the 17th embodiment.

In FIG. 30, after an alignment mark is formed at a predetermined position on the wafer, a resist is applied onto the wafer (step S211). The wafer is mounted on the stage (step S212). Pre/fine alignment is made at a pre/fine alignment position (step S213). The stage is moved to a predetermined exposure shot position (step S214), and interference exposure is made at that position (step S215). It is then checked if the next exposure region remains (step S216). If the next exposure region remains (NO in step S216), the flow returns to step S214. On the other hand, if no next exposure region remains (YES in step S216), the flow advances, to step S217.

In order to detect position by the alignment system using near-field light, the stage is driven to a predetermined near-field light alignment position (step S217), and alignment using the near-field light is done at that alignment position (step S218). Exposure light based on near-field light is then irradiated onto the wafer to form a desired pattern (step S219). It is checked if the next exposure region remains (step S220). If the next exposure region remains (NO in step S220), the flow returns to step S217. On the other hand, if no next exposure region remains (YES in step S220), the flow advances to step S221.

Upon completion of pattern formation, the wafer is detached (step S221). The exposed wafer is developed to form the pattern (step S222). The developed wafer undergoes a process treatment including etching, ion implantation, film formation, and the like (step S223).

Upon exposing a coarse pattern, in the present invention, the 13th to 16th embodiments use excimer stepper exposure, and the 17th embodiment uses interference exposure. Also, as the exposure method of the coarse pattern, equal-magnification X-ray exposure, reduction X-ray exposure, EB exposure, electron beam holography exposure, and the like may be used.

An embodiment of a method of manufacturing a semiconductor device using the above-mentioned exposure device will be explained below.

Figure 31:
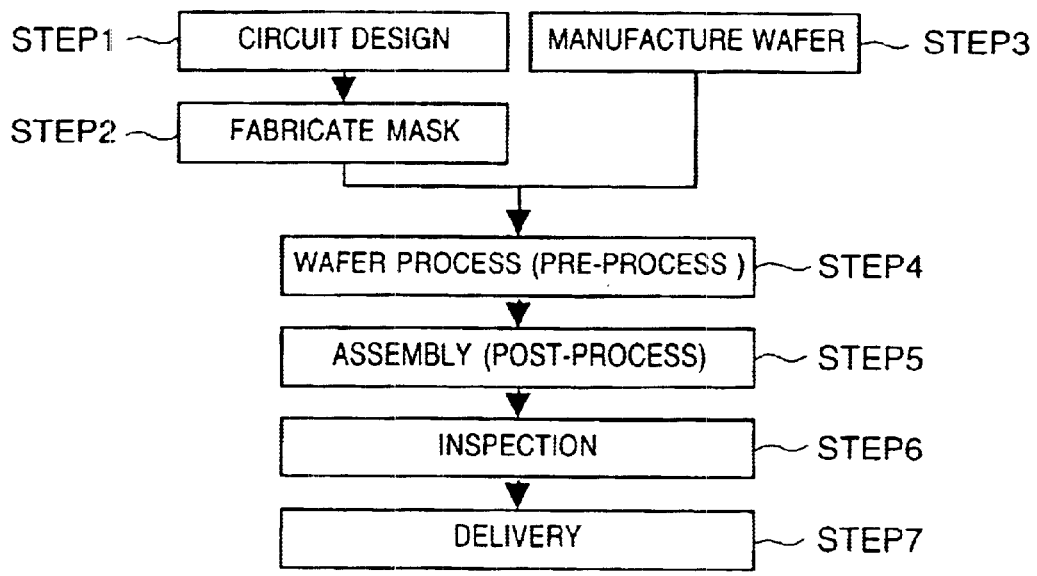
FIG. 31 is a flow chart of the device manufacturing method.

FIG. 31 is a flow chart showing the manufacturing process of a semiconductor device (semiconductor chips such as ICs, LSIs, liquid crystal panels, CCDs, and the like).

In step 1 (circuit design), the circuit design of a semiconductor device is made. In step 2 (manufacture mask), a mask formed with a designed circuit pattern is manufactured.

In step 3 (fabricate wafer), a wafer is fabricated using materials such as silicon and the like. Step 4 (wafer process) is called a pre-process, and an actual circuit is formed by lithography using the prepared mask and wafer.

The next step 5 (assembly) is called a post-process, in which semiconductor chips are assembled using the wafer obtained in step 4, and includes an assembly process (dicing, bonding), a packaging process (encapsulating chips), and the like.

In step 6 (inspection), inspections such as operation tests, durability tests, and the like of semiconductor devices assembled in step 5 are run. Semiconductor devices are completed via these processes, and are delivered (step 7).

Figure 32:
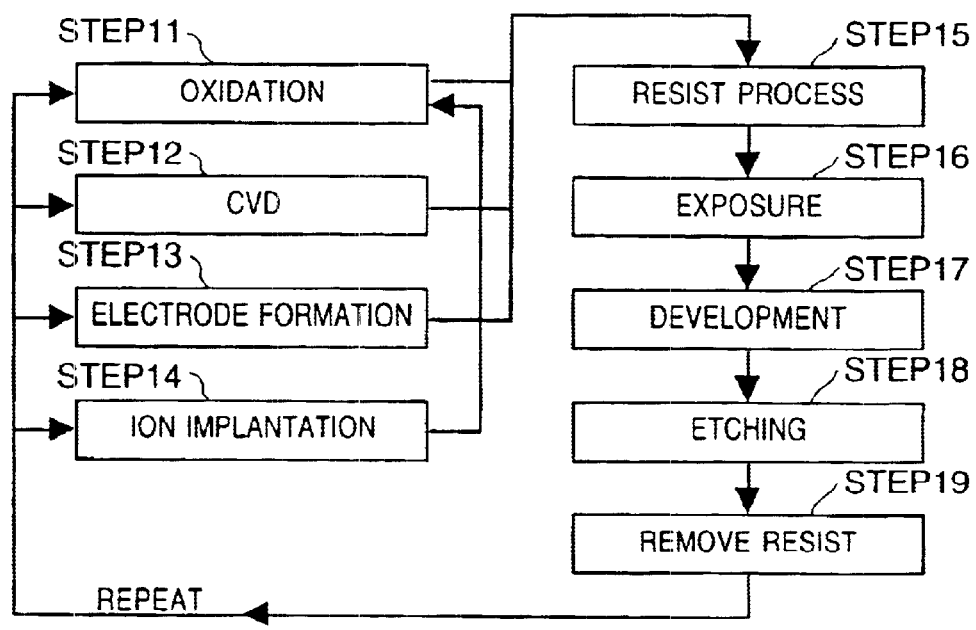
FIG. 32 is a flow chart of the wafer process of the device manufacturing method.

FIG. 32 is a flow chart showing the wafer process in detail. In step 11 (oxidation), the surface of the wafer is oxidized. In step 12 (CVD), an insulating film is formed on the wafer surface.

In step 13 (electrode formation), electrodes are formed by deposition on the wafer. In step 14 (ion implantation), ions are implanted into the wafer. In step 15 (resist process), a photosensitive agent is applied on the wafer. In step 16 (exposure), the circuit pattern on the mask is printed on the wafer by exposure using the above-mentioned exposure apparatus.

Instep 17 (development), the exposed wafer is developed. In step 18 (etching), a portion other than the developed resist image is removed by etching. In step 19 (remove resist), the resist film which has become unnecessary after etching is removed. By repetitively executing these steps, multiple circuit patterns are formed on the wafer.

Note that a highly integrated device can be easily manufactured using the manufacturing method of this embodiment.

As described above, according to the 13th to 17th embodiments, an exposure apparatus which can appropriately form a pattern in accordance with its structure, and is suitable for a micro-working machine for manufacturing devices such as semiconductor devices, and a device manufacturing method using the same can be achieved.

Especially, since a coarse pattern is formed by conventional exposure, and a fine pattern is formed by near-field exposure, fine patterns can be exposed with high throughput.

Upon exposing a fine pattern, an image which has a resolution as low as the wavelength order upon detecting an alignment mark by a conventional system can be obtained to have a resolution as high as 1/100 or less the wavelength, i.e., the nanometer order, by using a near-field optical system, and subnanometer position detection can be realized. When the near-field exposure apparatus is used, micro-working on the nanometer order can be attained. When the two systems are combined, micro-working for an exposure region over a broader range can be realized.

Since such micro-working on the nanometer order is attained, a device that provides its function with a structure on the nanometer order can be manufactured.

As many apparently widely different embodiments of the present invention can be made without departing from the spirit and scope thereof, it is to be understood that the invention is not limited to the specific embodiments thereof except as defined in the appended claims.

What is claimed is:

1. A position detection device for detecting a position of an object on which an alignment mark and a resist covering the alignment mark are formed, said device comprising:

an illuminator for illuminating the alignment mark with pumping light, wherein the pumping light has a wavelength longer than a thickness of the resist;

a probe for detecting near-field light generated by the alignment mark upon irradiation of the pumping light; and a detection system for detecting the position of the object based on the detection by said probe.

2. The device according to claim 1, wherein said probe comprises a microparticle.

3. The device according to claim 2, wherein a position of the microparticle is controlled by optical trapping.

4. A working apparatus for detecting position information of a member to be worked, said working apparatus comprising:

a position detection device of claim 1; and a working device for working a surface of the member to be worked using the position information.

5. An evaluation apparatus for detecting position information of a specimen to be evaluated, said evaluation apparatus comprising:

a position detection device of claim 1; and an inspecting device for inspecting the specimen to be evaluated using the position information.

6. An exposure apparatus for detecting position information of an object to be exposed, said exposure device comprising:

a position detection device of claim 1; and an exposing device for exposing a surface of the object using the position information.

7. The device according to claim 1, wherein said probe includes a micro ball.

8. A positioning apparatus for acquiring position information of an object, said positioning apparatus comprising:

a position detection device of claim 1; and a positioning device for positioning the object at a desired position in the direction by driving a stage upon which the object is placed.

9. A laser working apparatus for acquiring position information of an object to be worked, said laser working apparatus comprising:

a position detection device of claim 1; and a working device for working the object on the basis of the position information.

10. An apparatus according to claim 4, wherein a probe of the position detection device comprises a microparticle.

11. An apparatus according to claim 10, wherein a position of the microparticle is controlled by optical trapping.

12. An apparatus according to claim 5, wherein a probe of the position detection device comprises a microparticle.

13. An apparatus according to claim 12, wherein a position of the microparticle is controlled by optical trapping.

14. An apparatus according to claim 6, wherein a probe of the position detection device comprises a microparticle.

15. An apparatus according to claim 14, wherein a position of the microparticle is controlled by optical trapping.

16. An apparatus according to claim 8, wherein a probe of the position detection device comprises a microparticle.

17. An apparatus according to claim 16, wherein a position of the microparticle is controlled by optical trapping.

18. An apparatus according to claim 9, wherein a probe of the position detection device comprises a microparticle.

19. An apparatus according to claim 18, wherein a position of the microparticle is controlled by optical trapping.

20. A pattern detecting device for detecting a pattern which is covered by a resist, said device comprising:

an illuminator for illuminating the pattern with pumping light, wherein said pumping light has a wavelength longer than a thickness of the resist; and a probe for receiving near-field light generated by the pattern upon irradiation of the pumping light to detect the pattern.

* * * * *

UNITED STATES PATENT AND TRADEMARK OFFICE
CERTIFICATE OF CORRECTION

PATENT NO. : 6,806,477 B1
DATED : October 19, 2004
INVENTOR(S) : Kenji Saito et al.

It is certified that error appears in the above-identified patent and that said Letters Patent is hereby corrected as shown below:

<u>Title page,</u>
Item [56], References Cited, U.S. PATENT DOCUMENTS,
"5,121,256 A 6/1992 Corle et al. ........................... 359/664" should read
-- 5,121,256 A 6/1992 Corie et al. …………………….. 359/664 --.

<u>Column 1,</u>
Line 60, "in-th-order" should read -- ±n-th-order --.

<u>Column 11,</u>
Line 32, "wafer Sin" should read -- wafer 5 in --.

<u>Column 13,</u>
Line 67, "state" should read -- state. --.

<u>Column 14,</u>
Line 48, "a" should read -- to a --.

<u>Column 17,</u>
Line 60, "applied with a resist 33" should read -- to which a resist 33 has been applied --.

<u>Column 18,</u>
Line 34, "applied with a resist 33" should read -- to which a resist 33 has been applied. --.

<u>Column 24,</u>
Line 32, "of$\lambda$=248" should read -- of $\lambda$=248 --.
Line 53, "apainted" should read -- are painted --.

UNITED STATES PATENT AND TRADEMARK OFFICE
CERTIFICATE OF CORRECTION

PATENT NO. : 6,806,477 B1
DATED : October 19, 2004
INVENTOR(S) : Kenji Saito et al.

It is certified that error appears in the above-identified patent and that said Letters Patent is hereby corrected as shown below:

Column 26,
Line 6, "Instep" should read -- In step --.

Signed and Sealed this

Nineteenth Day of April, 2005

JON W. DUDAS
*Director of the United States Patent and Trademark Office*